(12) United States Patent
Chen et al.

(10) Patent No.: US 8,450,157 B2
(45) Date of Patent: May 28, 2013

(54) METHODS OF MANUFACTURING MASTER, PIXEL ARRAY SUBSTRATE AND ELECTRO-OPTICAL DEVICE

(75) Inventors: Pei-Ming Chen, Hsinchu (TW); Chih-Hung Shih, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 6 days.

(21) Appl. No.: 13/338,242

(22) Filed: Dec. 28, 2011

(65) Prior Publication Data

US 2012/0100653 A1 Apr. 26, 2012

Related U.S. Application Data

(62) Division of application No. 12/035,445, filed on Feb. 22, 2008, now Pat. No. 8,134,210.

(30) Foreign Application Priority Data

Oct. 25, 2007 (TW) .............................. 96140059 A

(51) Int. Cl.
*H01L 23/60* (2006.01)
(52) U.S. Cl.
USPC ......................................... 438/140; 438/155
(58) Field of Classification Search
CPC ................................................... H01L 29/0619
USPC ................... 438/140, 155, 380, 454; 257/88, 257/173, 324, 355–364, E29.008, E29.014, 257/E29.226; 349/40, 149, 152
See application file for complete search history.

(56) References Cited

U.S. PATENT DOCUMENTS

| | | | |
|---|---|---|---|
| 7,061,020 B2 * | 6/2006 | Chae ................................ | 257/72 |
| 7,456,475 B2 * | 11/2008 | Tang et al. .................... | 257/347 |
| 7,719,624 B2 * | 5/2010 | Liao et al. ....................... | 349/40 |
| 2005/0078232 A1 * | 4/2005 | Lo et al. .......................... | 349/40 |
| 2010/0025698 A1 * | 2/2010 | Shih et al. ....................... | 257/88 |

* cited by examiner

*Primary Examiner* — Cuong Q Nguyen
*Assistant Examiner* — Yosef Gebreyesus
(74) *Attorney, Agent, or Firm* — Jianq Chyun IP Office

(57) ABSTRACT

A master having a substrate including displaying units and an ESD protection structure including an adjacent first region and a second region is provided. The displaying units have a predetermined-cutting region therebetween. Each displaying unit includes a peripheral circuit region and a display region having pixels. The ESD protection structure disposed on the predetermined-cutting region, located in the peripheral circuit region, and connecting the display region includes a first patterned conductive layer disposed on the first region and having an end away from the predetermined-cutting region, a first patterned dielectric layer disposed on the first patterned conductive layer and the substrate and having a first opening exposing a portion of the first patterned conductive layer, a patterned transparent conductive layer disposed corresponding to the predetermined-cutting region and connecting the first patterned conductive layer, and a second patterned dielectric layer covering the patterned transparent conductive layer and the substrate.

8 Claims, 27 Drawing Sheets

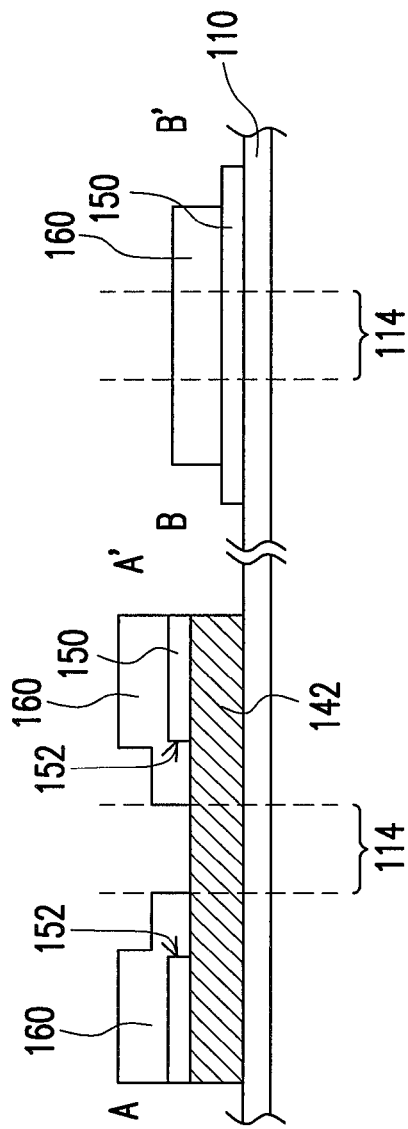
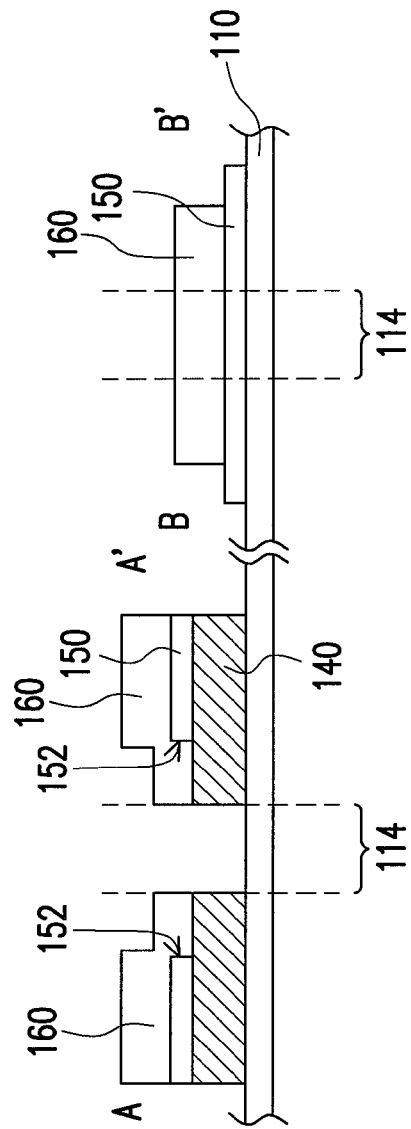
FIG. 2C
FIG. 2D

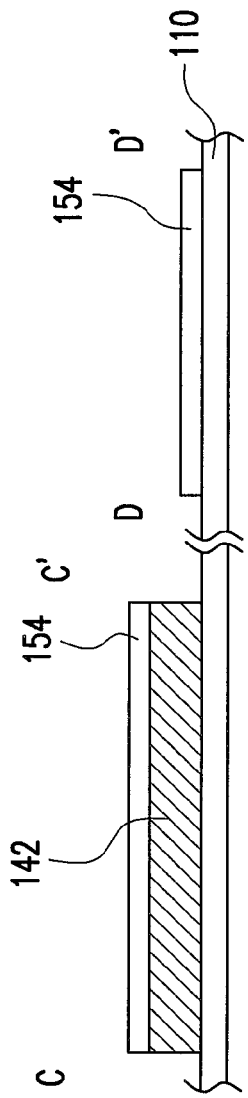
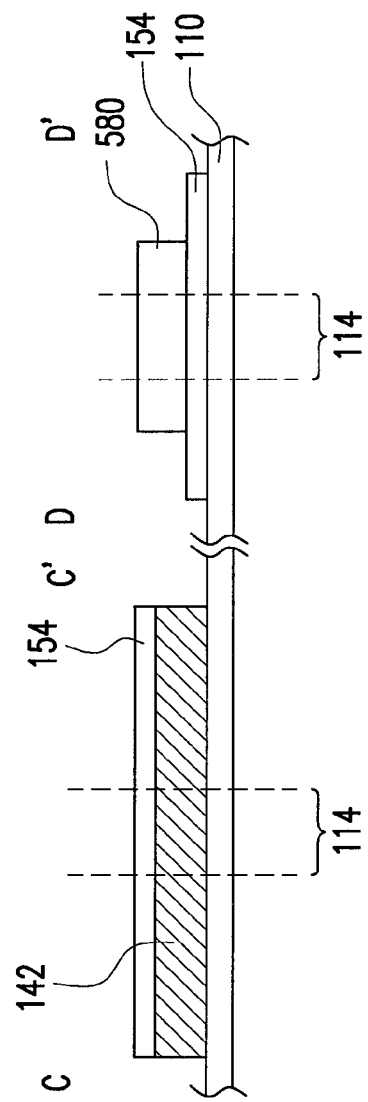

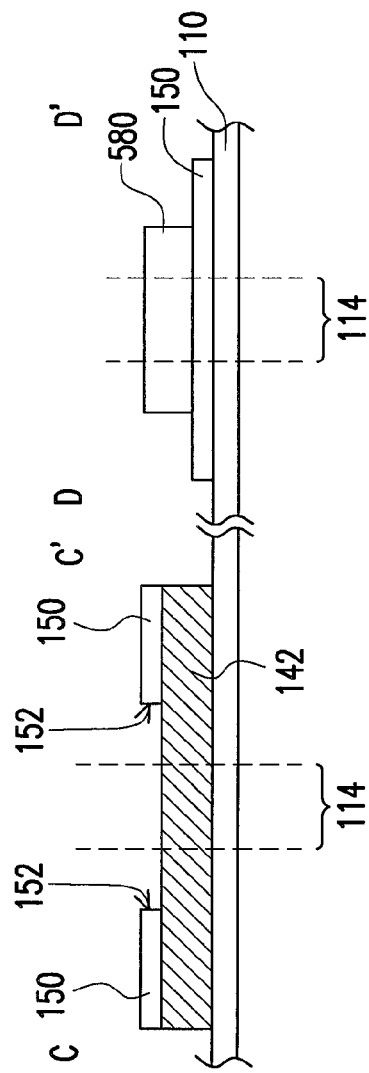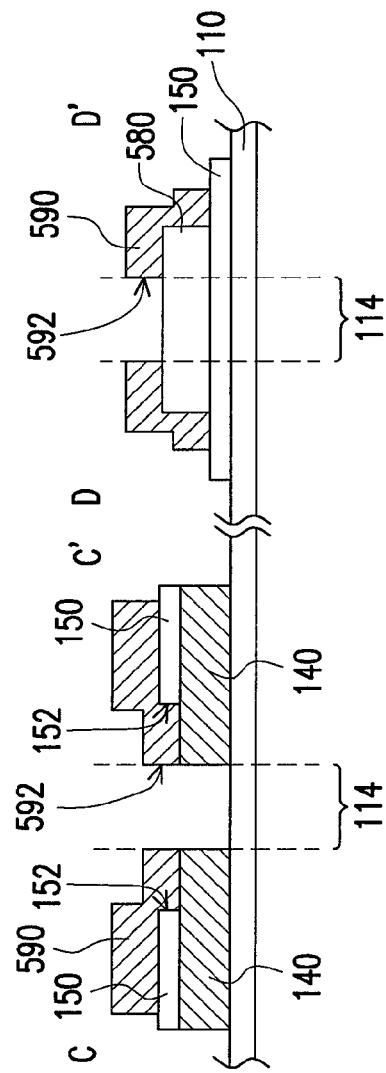

METHODS OF MANUFACTURING MASTER, PIXEL ARRAY SUBSTRATE AND ELECTRO-OPTICAL DEVICE

CROSS-REFERENCE TO RELATED APPLICATION

This is a divisional of and claims the priority benefit of an application Ser. No. 12/035,445, filed on Feb. 22, 2008, now in condition of allowance, which claims the priority benefit of Taiwan application serial no. 96140059, filed on Oct. 25, 2007. The entirety of the above-mentioned patent applications is hereby incorporated by reference herein and made a part of this specification.

BACKGROUND OF THE INVENTION

1. Field of the Invention

The present invention relates to a master, a pixel array substrate, an electro-optical device, and methods of manufacturing the said elements. More particularly, the present invention relates to a master having an electrostatic discharge (ESD) protection structure, a pixel array substrate, an electro-optical device, and methods of manufacturing the said elements.

2. Description of Related Art

An ESD phenomenon is quite common in our daily lives. Since various objects are of different electron affinities, charge-transferring reactions are likely to be generated when any two objects are brought into contact and then separated, thus leading to an accumulation of electrostatic charges. As long as the electrostatic charges in the objects are accumulated to a certain degree, a sudden and momentary electric current flows between the two objects occurs when one of the objects carrying the electrostatic charges is in contact with or approaching to the other object at a different electrical potential, leading to an ESD event.

A liquid crystal display (LCD) panel is herein taken for an example. During processes of manufacturing, producing, assembling, delivering, and using the LCD panel, the LCD panel is very much likely to suffer the ESD damage. Therefore, the LCD panel must be equipped with a design of preventing the ESD damage, such that the lifetime of the LCD panel is effectively extended. In general, the LCD panel includes a pixel array substrate, an opposite substrate, and a liquid crystal layer disposed therebetween. Here, the fabrication of the pixel array substrate is taken for an example. In order to improve the manufacturing efficiency, a plurality of displaying units is often formed on a master of a glass substrate. Thereafter, through an implementation of a cutting process, the displaying units are cut off, so as to form a plurality of pixel array substrates.

In addition, during the formation of the displaying units, an ESD protection circuit characterized by satisfactory conductivity can be formed on the glass substrate for connecting each of the displaying units. The ESD protection circuit is capable of conducting the electrostatic charges out of the displaying units, given that the accumulation of the electrostatic charges takes place in any step of the manufacturing process, so as to avoid circuits or elements in each of the displaying units from suffering the permanent ESD damage. Further, after the displaying units are cut off and a plurality of the pixel array substrates is formed, the ESD protection circuit is also conducive to releasing the electrostatic charges possibly generated during the assembling process, the delivering process, or even after consumers purchasing the LCD panels start using the same. Accordingly, a disposition of the ESD protection circuit results in an extension of the lifetime of the LCD panel to which the pixel array substrate is applied.

However, when the displaying units are cut off and the plurality of the pixel array substrates is formed, the ESD protection circuit made of a metallic material is exposed, wherein the metallic material within non-transparent function consists of Au, Ag, Al, Sn, Cu, Ti, Ta, Mo, W, Nd, or others, or alloy thereof. In subsequent processes of inspecting the panel, the exposed metal may be corroded or oxidized, further posing a negative impact on display performance of the LCD panel. In light of the foregoing, the conventional LCD panel cannot simultaneously achieve favorable display performance and maintain the lifetime of the LCD panel.

SUMMARY OF THE INVENTION

The present invention is directed to a master for resolving an issue that a metallic material (e.g. an ESD protection circuit) on a cutting surface is exposed after the master is cut.

The present invention is further directed to a pixel array substrate for preventing display performance from being adversely affected due to a corrosion of an exposed metallic material (e.g. an ESD protection circuit).

The present invention is further directed to a method of manufacturing a master in which no metallic material (e.g. an ESD protection circuit) is exposed after the master is cut.

The present invention is further directed to a method of manufacturing a pixel array substrate with a relatively favorable display quality.

The present invention is further directed to an electro-optical device of good quality.

The present invention is further directed to a method of manufacturing an electro-optical device. The method is conducive to an improvement of manufacturing yield of the electro-optical device.

The present invention provides a master including a substrate and at least an ESD protection structure. The substrate has a plurality of displaying units and at least a predetermined-cutting region therebetween. Each of the displaying units includes at least a peripheral circuit region and a display region having a plurality of pixels. The ESD protection structure is disposed on the predetermined-cutting region, located in the peripheral circuit region, and connected to the display region. The ESD protection structure has at least a first region and at least a second region adjacent to the first region. Further, the ESD protection structure includes a first patterned conductive layer, a first patterned dielectric layer, a patterned transparent conductive layer, and a second patterned dielectric layer. The first patterned conductive layer is disposed on the first region, and an end of the first patterned conductive layer is away from the predetermined-cutting region. The first patterned dielectric layer is disposed on the first patterned conductive layer and the substrate. The first patterned dielectric layer has at least a first opening exposing a portion of the first patterned conductive layer. The patterned transparent conductive layer is disposed on the substrate and electrically connects the first patterned conductive layer. The second patterned dielectric layer covers the patterned transparent conductive layer and the substrate.

The present invention further provides a pixel array substrate including a substrate and at least an ESD protection structure. The substrate includes at least a peripheral circuit region and a display region having a plurality of pixels. The ESD protection structure disposed in the peripheral circuit region and connected to the display region has at least a first region and at least a second region adjacent to the first region. Further, the ESD protection structure includes a first patterned conductive layer, a first patterned dielectric layer, a patterned transparent conductive layer, and a second patterned dielectric layer. The first patterned conductive layer is disposed on the first region, and an end of the first patterned conductive layer is away from an edge of the substrate. The first patterned dielectric layer is disposed on the first patterned conductive layer and the substrate, and the first patterned dielectric layer exposes a portion of the first patterned conductive layer. The patterned transparent conductive layer is disposed on the substrate and is electrically connected to the first patterned conductive layer. The second patterned dielectric layer covers the patterned transparent conductive layer and the substrate.

The present invention further provides a method of manufacturing a master. The master includes a substrate and at least an ESD protection structure. The substrate has a plurality of displaying units having at least a predetermined-cutting region therebetween. Each of the displaying units includes at least a peripheral circuit region and a display region having a plurality of pixels. The ESD protection structure is disposed on the predetermined-cutting region, located in the peripheral circuit region, and connected to the display region. Further, the ESD protection structure has at least a first region and at least a second region adjacent to the first region. The method of manufacturing the ESD protection structure includes forming a first patterned conductive layer on the first region. Here, an end of the first patterned conductive region is away from the predetermined-cutting region. Next, a first patterned dielectric layer is formed on a first conductive layer and the substrate. Here, the first patterned dielectric layer has at least a first opening exposing a portion of the first patterned conductive layer. A patterned transparent conductive layer is disposed on the substrate and electrically connecting the first patterned conductive layer is then constructed. Thereafter, a second patterned dielectric layer is formed on the patterned transparent conductive layer and the substrate.

The present invention further provides a method of manufacturing a pixel array substrate. In the method, the master described in the above-mentioned embodiment is provided at first. The master is cut along the predetermined-cutting region thereof. Here, an end of the first patterned conductive layer on the first region and an end of the patterned transparent conductive layer thereon are covered by the second patterned dielectric layer, while a side of the patterned transparent conductive layer on the second region is exposed.

The present invention further provides a method of manufacturing a pixel array substrate. First, a master is provided. The master includes a substrate and at least an ESD protection structure. The substrate has a plurality of displaying units having at least a predetermined-cutting region therebetween. Each of the displaying units includes at least a peripheral circuit region and a display region having a plurality of pixels. The ESD protection structure is disposed on the predetermined-cutting region, located in the peripheral circuit region, and connected to the display region. The ESD protection structure has at least a first region and at least a second region adjacent to the first region. Further, the ESD protection structure also includes a first patterned conductive layer, a first patterned dielectric layer, a patterned semiconductor layer, a second patterned conductive layer, a patterned transparent conductive layer, and a second patterned dielectric layer. The first patterned conductive layer is disposed on the first region, and an end of the first patterned conductive layer is away from the predetermined-cutting region. The first patterned dielectric layer is disposed on the first patterned conductive layer and the substrate. The first patterned dielectric layer has at least a first opening exposing a portion of the first patterned conductive layer. The patterned semiconductor layer is disposed in the second region, such that a portion of the first patterned dielectric layer is disposed between the substrate and the patterned semiconductor layer. The second patterned conductive layer is disposed on the first patterned dielectric layer. Besides, the second patterned conductive layer has at least a third opening interlacing the first opening, such that the second patterned conductive layer is away from the predetermined-cutting region and is electrically connected to the first patterned conductive layer and the patterned semiconductor layer. The patterned transparent conductive layer is disposed on the substrate and electrically connects the first patterned conductive layer. The second patterned dielectric layer covers the patterned transparent conductive layer and the substrate. After that, the master is cut along the predetermined-cutting region. Here, a side of the patterned transparent conductive layer on the first region, a side of the patterned transparent conductive layer on the second region, a side of the first patterned dielectric layer thereon, and a side of the patterned semiconductor layer thereon are exposed.

The present invention further provides an electro-optical device including the above-mentioned pixel array substrate.

The present invention further provides a method of manufacturing an electro-optical device including the method of manufacturing the above-mentioned pixel array substrate.

In the present invention, a non-metallic conductive material is disposed on a region of the ESD protection structure, and said region corresponds to the predetermined-cutting region. Hence, a structure made of the metallic material (e.g. the ESD protection structure) does not exist in the predetermined-cutting region of the master. Namely, no metallic material is exposed by sides of the pixel array substrates formed by cutting the master. Thereby, as the pixel array substrate of the present invention is applied to any display panel, an issue regarding the corrosion of the metallic material is not apt to occur, giving rise to a desired display quality. On the other hand, the disposition of the non-metallic conductive material permits the ESD protection structure to conduct electrostatic charges, which is conducive to an extension of the lifetime of the pixel array substrate.

In order to the make the aforementioned and other objects, features and advantages of the present invention comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 2A through 2E are cross-sectional views illustrating a process of manufacturing an ESD protection structure along sectional lines A-A' and B-B' of FIG. 1 according to the first embodiment of the present invention.

FIGS. 6A through 6E are cross-sectional views illustrating the process of manufacturing the ESD protection structure along sectional lines C-C' and D-D' of FIG. 5 according to the second embodiment of the present invention.

DESCRIPTION OF EMBODIMENTS

First Embodiment

Figure 1:
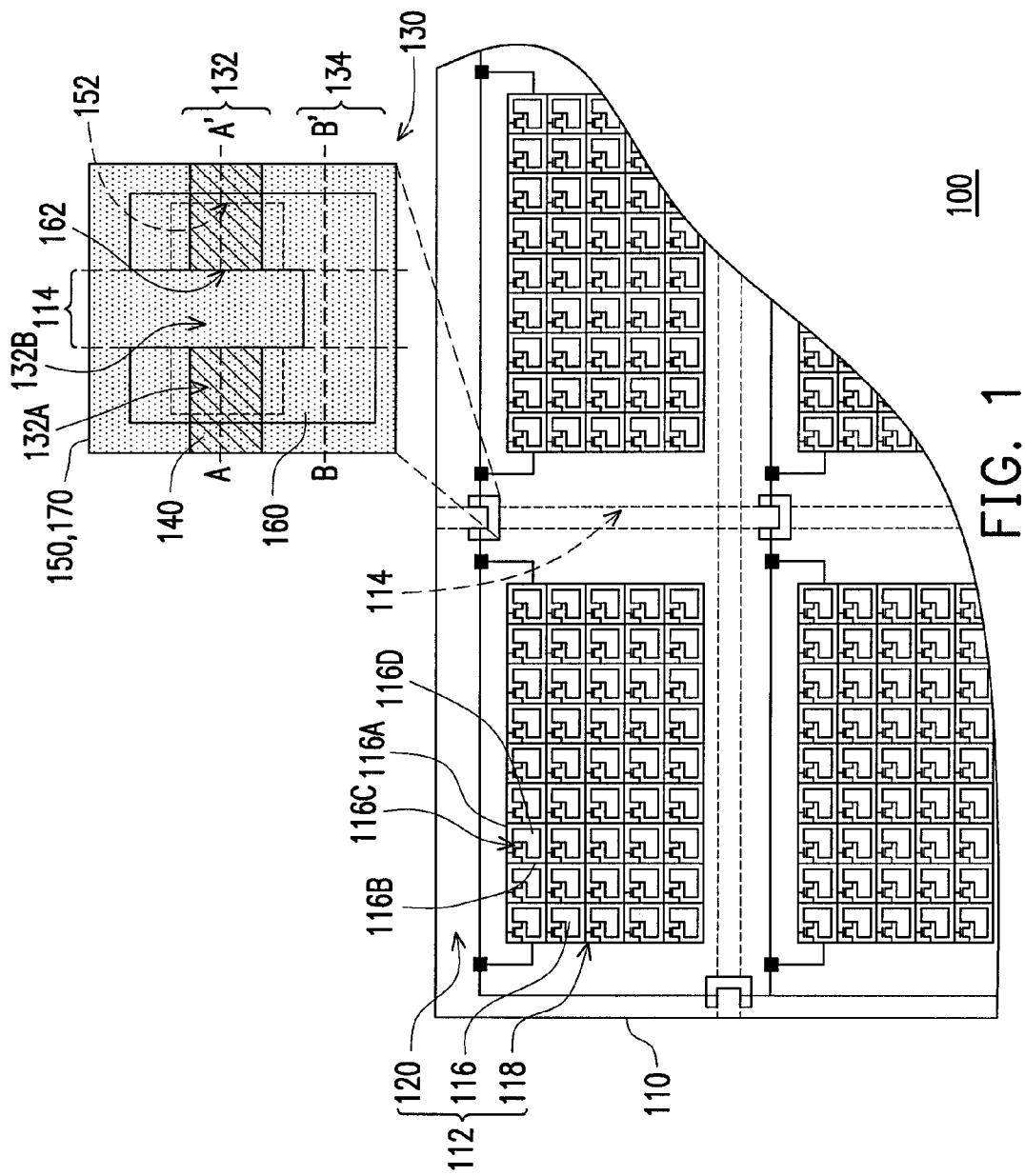
FIG. 1 is a partial top view schematically illustrating a master according to a first embodiment of the present invention.

FIG. 1 is a partial top view schematically illustrating a master according to a first embodiment of the present invention. Referring to FIG. 1, a master 100 or namely mother board or master substrate includes a substrate 110 and at least an ESD protection structure 130. The substrate 110 has a plurality of displaying units 112 having at least a predetermined-cutting region 114 therebetween. Each of the displaying units 112 includes a display region 118 having a plurality of pixels 116 and at least a peripheral circuit region 120 adjacent to the display region 118. In the present embodiment, at least one peripheral circuit region 120 surrounding the display region 118 is provided, which is not limited in the present invention. The ESD protection structure 130 is disposed on the predetermined-cutting region 114, located in the peripheral circuit region 120, and connected to the display region 118. For example, the pixels 116 include scan lines 116A, data lines 116B, at least an active device 116C, and pixel electrodes 116D. In other embodiments, the pixels 116 further include at least one of the elements including a capacitance electrode (not shown), an alignment structure (not shown), spacers (not shown), and so on.

The ESD protection structure 130 has at least a first region 132 and at least a second region 134 adjacent to the first region 132. Further, the ESD protection structure 130 includes a first patterned conductive layer 140, a first patterned dielectric layer 150, a patterned transparent conductive layer 160, and a second patterned dielectric layer 170. The first patterned conductive layer 140 is disposed on a first section 132A of the first region 132, and an end of the first patterned conductive layer 140 is away from the predetermined-cutting region 114. A part of the predetermined-cutting region 114 is configured at a second section 132B of the first region 132, and the first section 132A does not overlap with the second section 132B. That is to say, the end away from the predetermined-cutting region 114 of the first patterned conductive layer 140 is not connected to the pixels 116, while the other end of the first patterned conductive layer 140 is connected to the pixels 116. The first patterned dielectric layer 150 is disposed on the first patterned conductive layer 140 and the substrate 110. The first patterned dielectric layer 150 has at least a first opening 152 exposing the part of the predetermined-cutting region 114 at the second section 132B of the first region 132 and a portion of the first patterned conductive layer 140 on the first section 132A of the first region 132. In the present embodiment, the first opening 152 corresponds to the predetermined-cutting region 114, so as to expose the end of the first patterned conductive layer 140, which is not limited in the present invention. That is to say, subsequent embodiments can also exemplify the above arrangement. The patterned transparent conductive layer 160 is disposed on the substrate 110 and at least configured on another part of the predetermined-cutting region 114 such as on second region 134 and at least one portion of the first region 132, i.e., corresponds to the portion of the predetermined-cutting region 114, and electrically connects the first patterned conductive layer 150. The second patterned dielectric layer 170 covers the patterned transparent conductive layer 160 and the substrate 110. In addition, the patterned transparent conductive layer 160 has at least a second opening 162 corresponding to the first opening 152.

The second opening 162 of the patterned transparent conductive layer 162 substantially defines a width of the predetermined-cutting region 114. In other words, a width of the second opening 162 is, for example approximately the same as the width of the predetermined-cutting region 114, denoting that a part of a side of the second opening 162 overlaps or aligns to the end of the first patterned conductive layer 140, which is not limited in the present invention. The width of the second opening 162 can also be different from the width of the predetermined-cutting region 114. That is to say, a part of the side of the second opening 162 is located within a projection area of the end of the first patterned conductive layer 140 and exposes the end of the first patterned conductive layer 140. The part of the side of the second opening 162 exposes the end of the first patterned conductive layer 140. In brief, the end of the first patterned conductive layer 140 is not within the predetermined-cutting region 114. As the master 100 is cut along the predetermined-cutting region 114, the first patterned conductive layer 140 is not exposed by the cutting surface of the master 100. Therefore, if the first patterned conductive layer 140 is made of or includes a metallic material, the quality of the product cut from the master 100 is not harmed by the corrosion of the exposed metallic material in subsequent inspecting and delivering processes. On the other hand, the patterned transparent conductive layer 160 connects the first patterned conductive layer 150, contributing to conducting accumulated electrostatic charges out of each of the displaying units 112 in the ESD protection structure 130. Accordingly, the ESD phenomenon is not apt to take place in the master 100, thus extending the lifetime of the master 100. To elaborate a protection function of the ESD protection structure 130 in the present embodiment, a manufacturing the ESD protection structure 130 of the master 100 is provided hereinafter. However, the present embodiment merely serves as an exemplary description of the present invention and should not be construed as a limitation thereto.

Figure 2A:
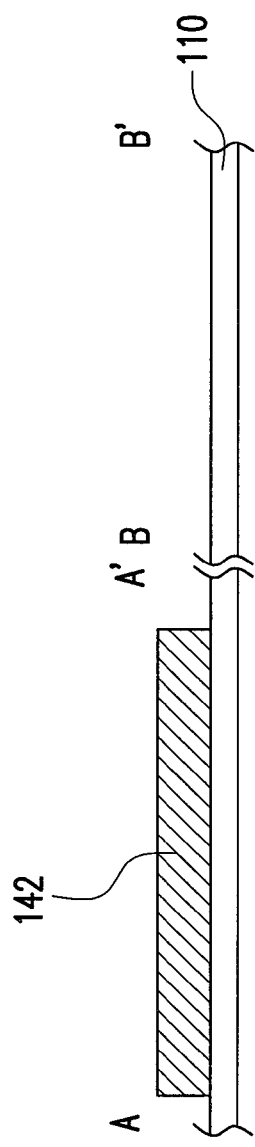

FIGS. 2A through 2E are cross-sectional views illustrating a process of manufacturing the ESD protection structure along sectional lines A-A' and B-B' of FIG. 1 according to the first embodiment of the present invention. FIGS. 3A through 3E are partial top views illustrating the process of manufacturing the ESD protection structure of the master depicted in FIG. 1. Referring to FIGS. 2A and 3A, a first conductive layer 142 is formed on the substrate 110 at first. The first conductive layer 142 is a single-layered structure or a multi-layered structure. A material of the first conductive layer 142 is, for example, gold, silver, copper, iron, tin, lead, hafnium, tungsten, molybdenum, neodymium, titanium, tantalum, aluminum, zinc, an alloy thereof, metal oxide thereof, metal nitride thereof, or a combination thereof. In other words, the first conductive layer 142 is a single layer structure or multi-layer structure and the total function of the structure thereof may be reflective. In the present embodiment, a first region 132 is, for example, defined in a location where the first conductive layer 142 is disposed, i.e., the location of the sectional line A-A'. In the master 100, the first conductive layer 142 is disposed in the peripheral circuit region 120 of each of the displaying units 112, and the first conductive layer 142 is, for example, connected to each of the display regions 118. In the manufacturing process, given that the electrostatic charges are accumulated in circuits of the display regions 118, the first conductive layer 142 is able to conduct the electrostatic charges out of the circuits. Hence, the first conductive layer 142 is capable of preventing ESD damages, which is conducive to manufacturing yield of the master 100.

In addition, a material of the substrate 110 includes an inorganic transparent material (e.g. glass, quartz, or other materials), an organic transparent material (e.g. polyolefin, polythiourea, polyalcohol, polyester, rubber, a thermoplastic polymer, a thermosetting polymer, polyarylene, polymethyl methacrylate, polycarbonate, other materials, derivatives thereof, or a combination thereof), an inorganic non-transparent material (e.g. silicon, ceramics, other materials, or a combination thereof), or a combination thereof. For example, the substrate 110 serves as a base in the pixel array substrate, and the substrate 110 made of glass, one of the inorganic transparent materials, is taken for an example in the present embodiment, which is not limited in the present invention.

Figure 2B:
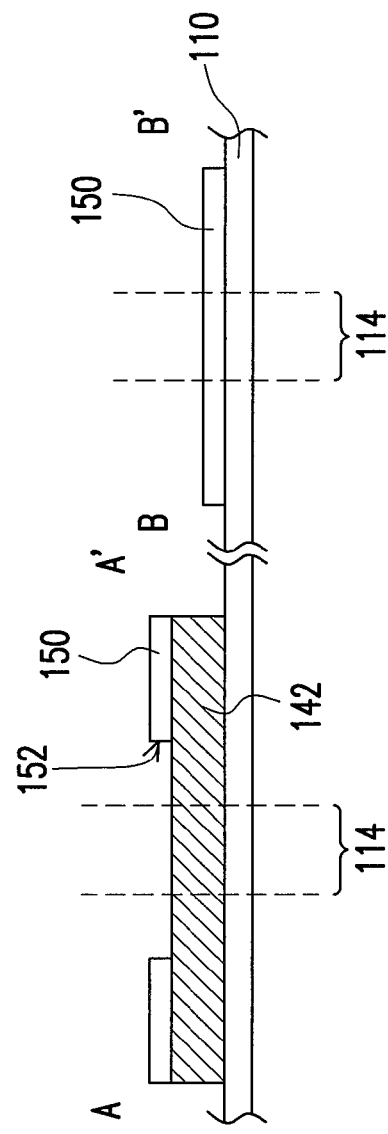
Figure 3A:
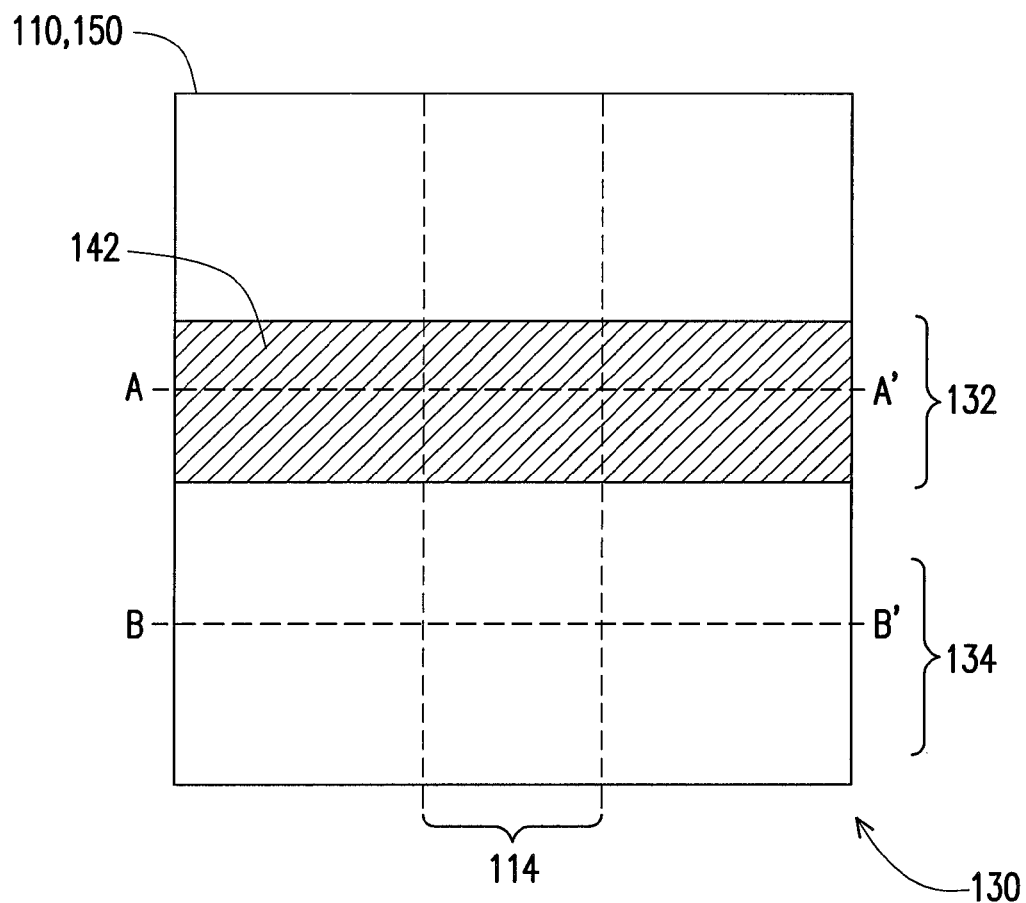
FIGS. 3A through 3E are partial top views illustrating the process of manufacturing the ESD protection structure of the master depicted in FIG. 1.
Figure 3B:
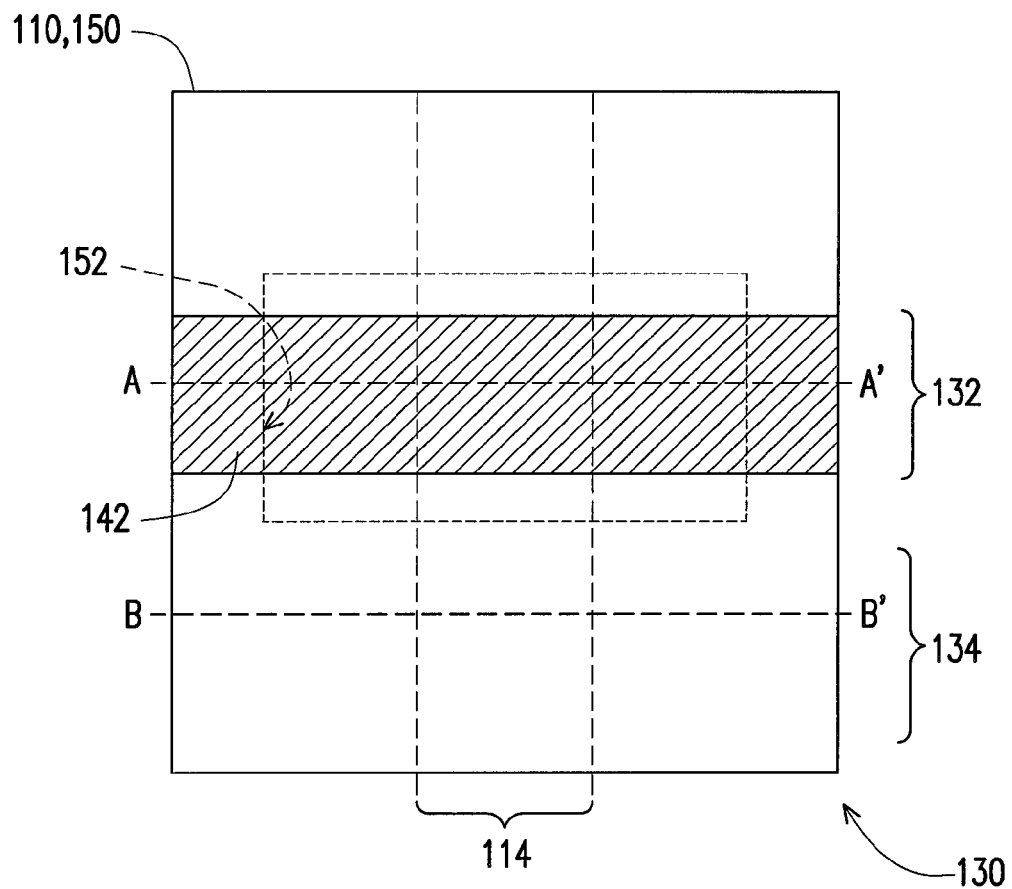

Next, referring to FIGS. 2B and 3B, a first patterned dielectric layer 150 is formed on the first conductive layer 142 and the substrate 110. The first patterned dielectric layer 150 has at least a first opening 152 exposing a portion of the first conductive layer 142, for example. A material of the first patterned dielectric layer 150 is, for example, an inorganic material (e.g. silicon oxide, silicon nitride, silicon oxynitride, silicon carbide, hafnium oxide, aluminum oxide, other materials, or a combination thereof), an organic material (e.g. photoresist, enzocyclobutane (BCB), cycloolefin, polyimide, polyamide, polyester, polyalcohols, polyethylene, polyphenylene, resin, polyether, polyketone, other materials, or a combination thereof), or a combination thereof. Note that the first opening 152 is, for example, corresponding to the predetermined-cutting region 114 of the master 100. Namely, the first opening 152 is disposed in a place which the connection region or the intersection region or the boundary region of each of the displaying units 112. In addition, a dimension of the first opening 152 is, for example, substantially greater than a width of the predetermined-cutting region 114, such that portions of the first conductive layer 142 in the predetermined-cutting region 114 and at respective sides of the predetermined-cutting region 114 are exposed. However, the dimension of the first opening 152 is not limited in the present invention. For example, the dimension of the first opening 152 can be substantially identical to the width of the predetermined-cutting region 114. Besides, according to other embodiments, the first opening 152 may extend along the predetermined-cutting region 114, such that the substrate 110 in the predetermined-cutting region 114 is exposed. In other words, an edge of the first patterned dielectric layer 150 may be disposed outside the predetermined-cutting region 114.

Figure 3C:
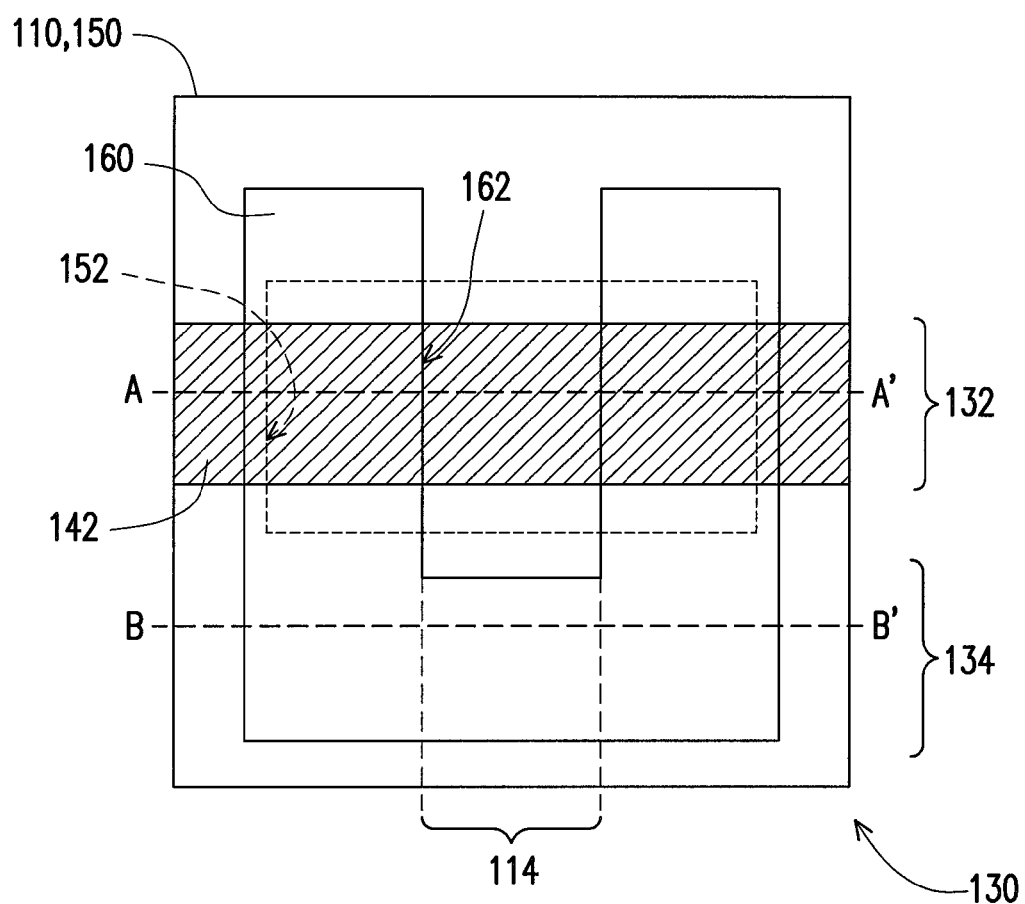
Figure 3D:
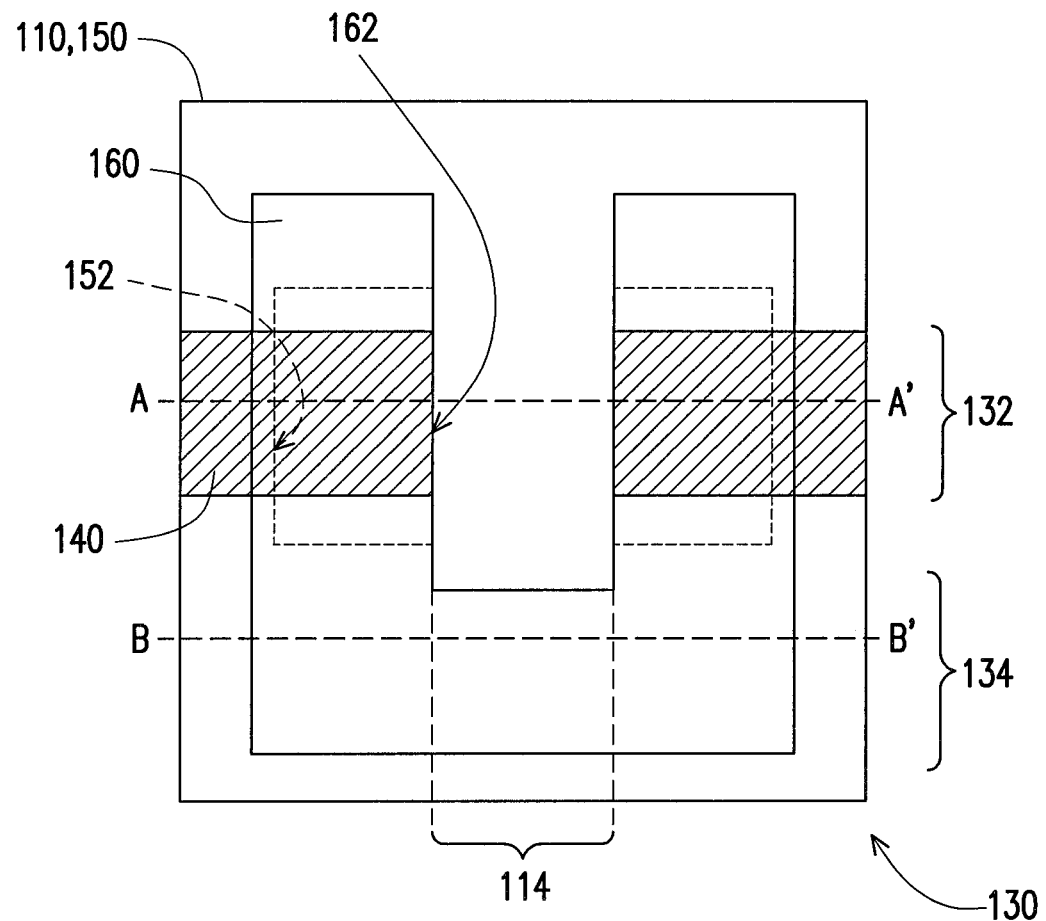

Thereafter, referring to FIGS. 2C and 3C, the patterned transparent conductive layer 160 connected to the first conductive layer 142 is formed. A method of forming the patterned transparent conductive layer 160 includes, for example, forming a transparent conductive material on the substrate 110 and performing a patterning process for forming the patterned transparent conductive layer 160 on the substrate 110 and connecting the first conductive layer 142. The transparent conductive material is, for example, indium tin oxide (ITO), indium zinc oxide (IZO), indium tin zinc oxide (ITZO), hafnium oxide, zinc oxide, aluminum oxide, aluminum tin oxide (ATO), aluminum zinc oxide (AZO), cadmium tin oxide (CTO), cadmium zinc oxide (CZO), or a combination thereof. In the present embodiment, an outline (a top view) of the patterned transparent conductive layer 160 is preferably a substantially annular pattern or a substantially curved pattern, for example. The substantially annular pattern includes a substantially rectangular pattern or a substantially circular pattern, while the substantially curved pattern includes a substantially inverted-U shaped pattern, a substantially U-shaped pattern, a substantially H-shaped pattern, a substantially S-shaped pattern, a substantially W-shaped pattern, a substantially V-shaped pattern, and so on. Besides, the second opening 162 constituted by a portion of the above-mentioned annular pattern or the curved pattern is disposed in the predetermined-cutting region 114, corresponds to the first opening 152, and exposes a portion of the first conductive layer 142. In practice, the second opening 162 of the patterned transparent conductive layer 160 exposes the first conductive layer 142 in the predetermined-cutting region 114. In addition, a portion of the patterned transparent conductive layer 160 is next to the first region 132 depicted in FIG. 1, so as to define the second region 134 where the sectional line B-B' is disposed.

Before the first conductive layer 142 is patterned, the first conductive layer 142 denotes consecutive metal conductive wires for releasing the electrostatic charges. However, after the master 100 is cut, an exposed side of the first conductive layer 142 in the predetermined-cutting region 114 may be corroded or oxidized in the subsequent inspecting process, thus adversely affecting the quality of the ESD protection structure 130. Accordingly, referring to FIGS. 2D and 3D, when the patterning process is performed to form the patterned transparent conductive layer 160, the first patterned conductive layer 140 is also patterned, so as to form a plurality of inconsecutive segments. In practice, the first conductive layer 142 disposed in the second opening 162 is intended to be removed in this step, such that the first patterned conductive layer 140 is formed. Hence, the end of the first patterned conductive layer 140 is, for example, aligned to a part of the side of the patterned transparent conductive layer 160 in the second opening 162, which is not limited in the present invention. In an alternative, the end of the first patterned conductive layer 140 may be located within the projection area of the part of the side of the patterned transparent conductive layer 160 in the second opening 162. It should be noted that the patterning process may be performed on the first conductive layer 142 with use of a photomask in the process depicted in FIG. 2A or FIG. 2B according to other embodiments, such that the first patterned conductive layer 140 can be formed at a different time from the formation of the patterned transparent conductive layer 160.

On the other hand, a portion of the patterned transparent conductive layer 160 is, for example, brought into contact with the first patterned conductive layer 140 exposed by the first opening 152. Namely, the patterned transparent conductive layer 160 corresponding to the predetermined-cutting region 114 is connected to the end of the first patterned conductive layer 140. Thereby, the patterned transparent conductive layer 160 and the first patterned conductive layer 140 together form a successive conductive circuit, contributing to releasing the accumulated electrostatic charges out of the substrate 110 during the manufacturing process of the ESD protection structure 130 or on various manufacturing conditions.

In other words, by means of the disposition of the patterned transparent conductive layer 160 in the present embodiment, the inconsecutive first patterned conductive layer 140 is combined together, such that a complete ESD protection circuit is constituted. As such, the elements of the substrate 110 are not likely to suffer the ESD damage, and favorable quality of the elements can be accomplished. In addition, when the substrate 110 is cut along a cutting region 144 in the subsequent manufacturing process, the first patterned conductive layer 140 made of the metallic material is not exposed and corroded. As a result, the quality of the ESD protection structure 130 can be ensured in the present embodiment.

Figure 2E:
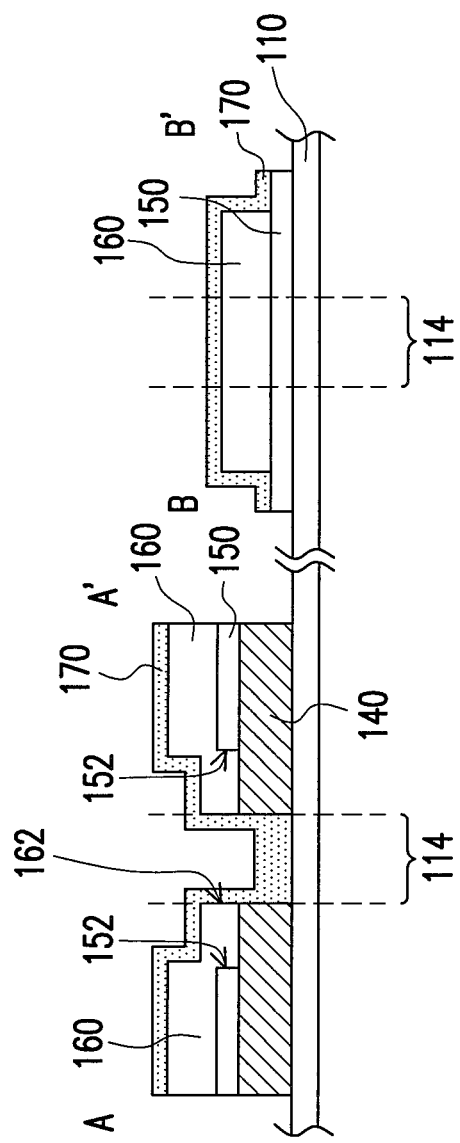
Figure 3E:
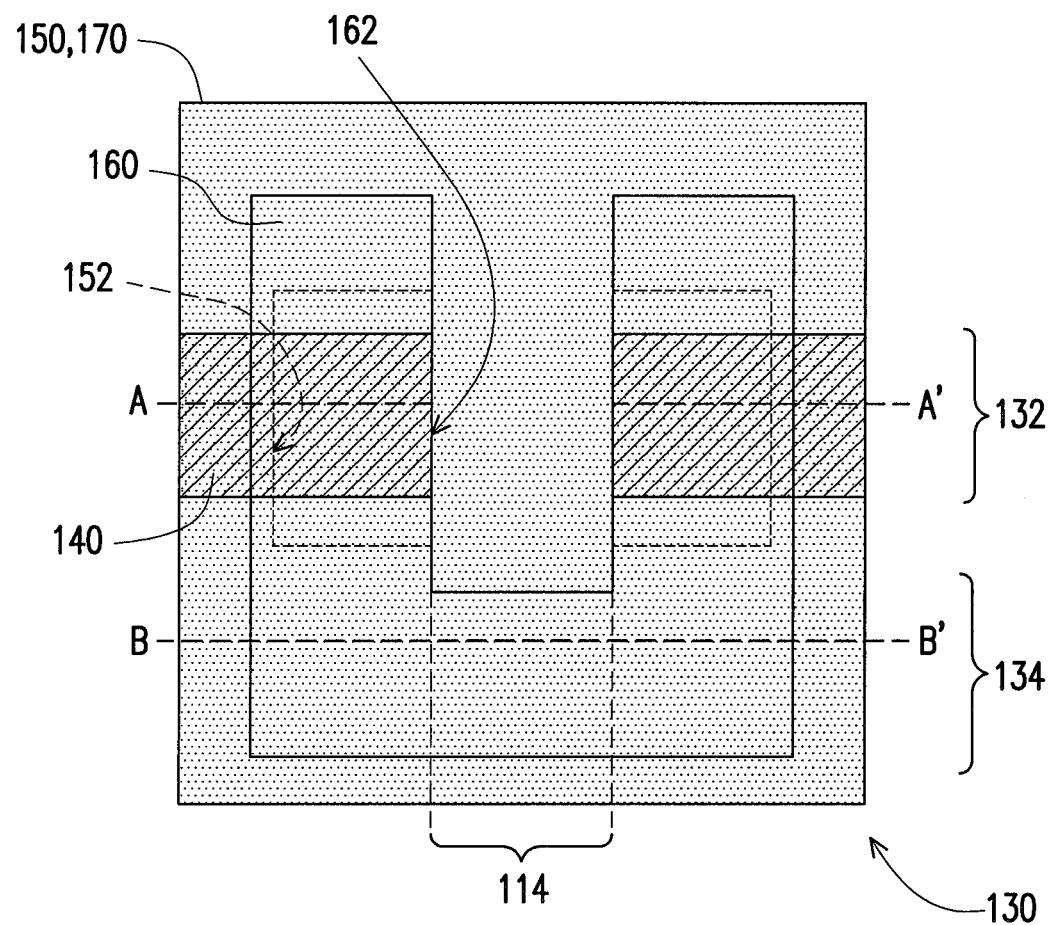

After that, referring to FIGS. 2E and 3E, a second patterned dielectric layer 170 is formed on the substrate 110 and the patterned transparent conductive layer 160, such that the fabrication of the ESD protection structure 130 is completed. A material of the second patterned dielectric layer 170 may include an organic dielectric material, and inorganic dielectric material, or a combination thereof Additionally, the material of the second patterned dielectric layer 170 can be selected from the materials of the first patterned dielectric layer 150 as discussed hereinbefore. In practice, the second patterned dielectric layer 170 covers a part of the side of the first patterned conductive layer 140 and a part of the side of the patterned transparent conductive layer 160, for example. Namely, the second patterned dielectric layer 170 conformally covers the first patterned conductive layer 140 and the patterned transparent conductive layer 160. Besides, a portion of the second patterned dielectric layer 170 disposed in the predetermined-cutting region 114 is directly disposed on the substrate 110, for example.

Further, referring to FIG. 1, during the fabrication of the ESD protection structure 130, a plurality of the pixels 116 can also be formed simultaneously in the display region 118 of each of the displaying units 112. To sum up, the conductive circuits used for conducting the unnecessary electrostatic charges out of the master 100 are available in each step of the process of manufacturing the master 100, thus resulting in the desired manufacturing field of the master 100. Even after the master 100 is cut for forming a plurality of the pixel array substrates, the favorable quality of the pixel array substrates can still be ensured.

Figure 4A:
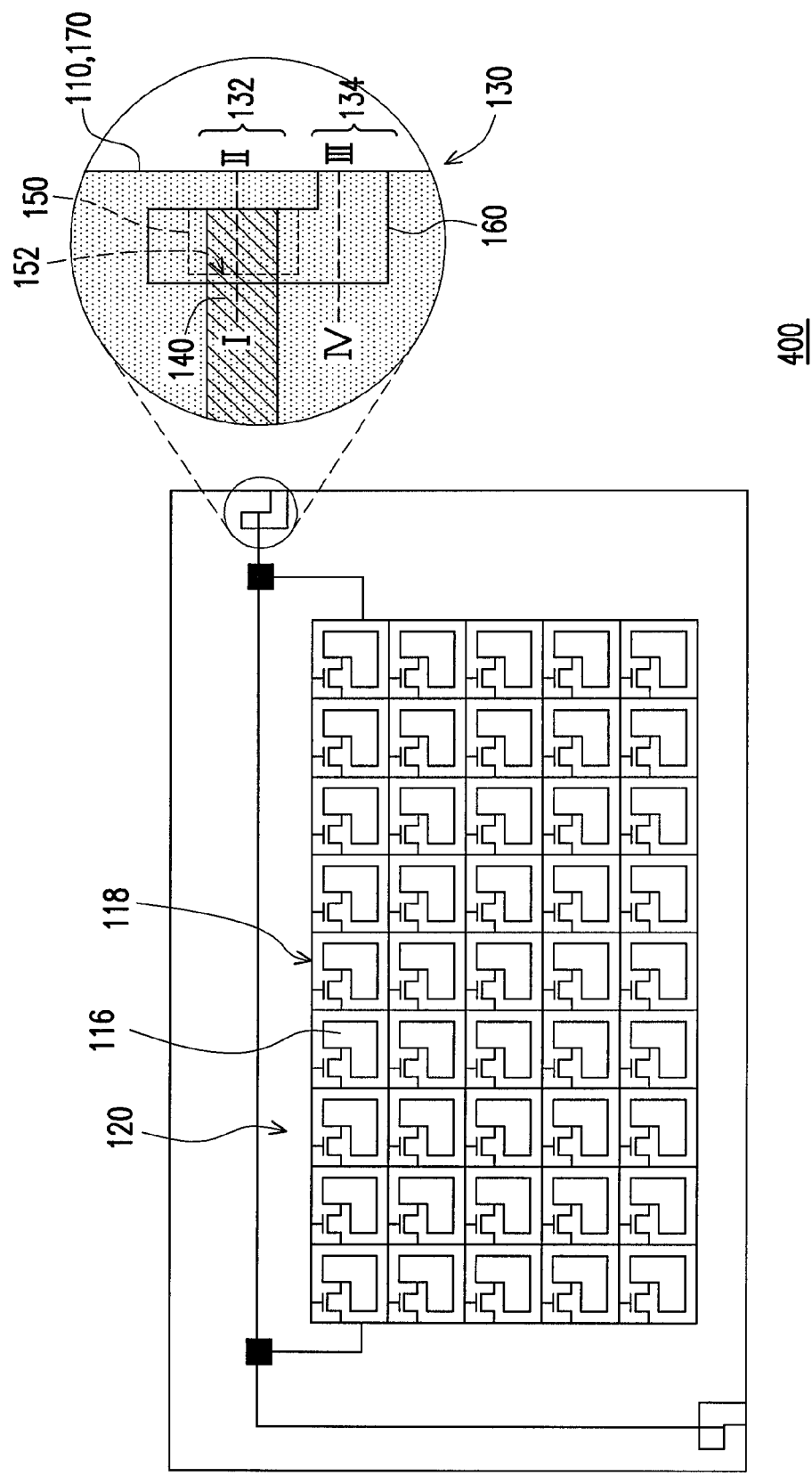
FIG. 4A is a top view schematically illustrating a pixel array substrate according to the first embodiment of the present invention.
Figure 4B:
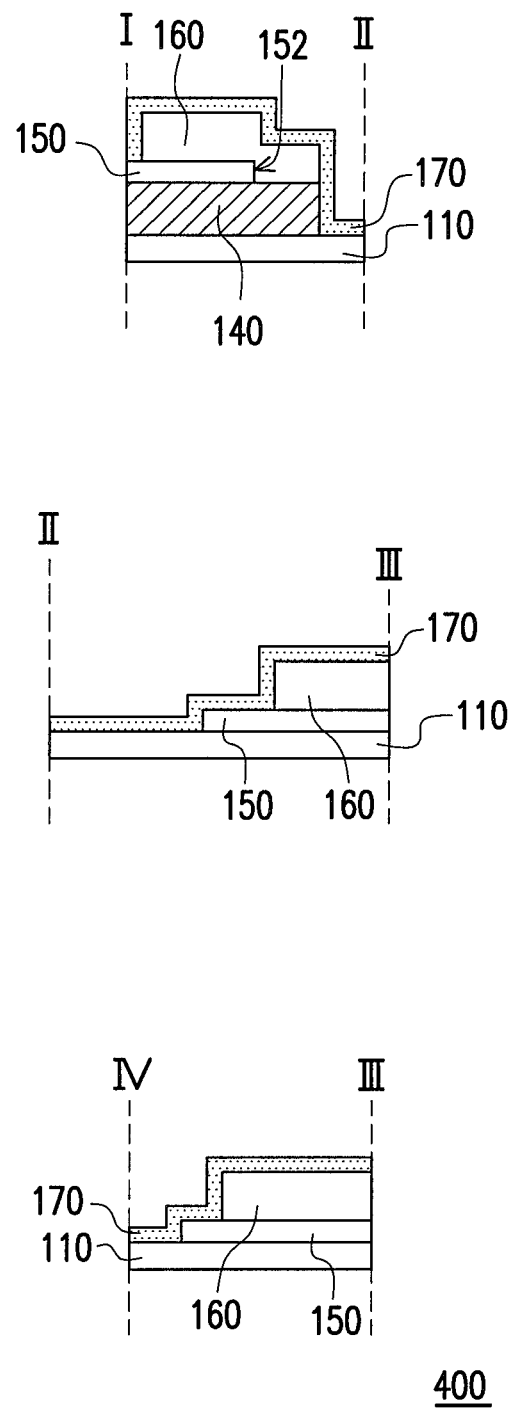
FIG. 4B is a schematic cross-sectional view along sectional lines I-II, and IV-III of FIG. 4A.

The master 100 includes a plurality of the displaying units 112. Hence, after the fabrication of the master 100 is completed, each of the displaying units 112 must be cut, so as to form a plurality of individual pixel array substrates through performing a laser cutting process, a blade cutting process, a roller cutting process, other cutting processes, or a combination thereof FIG. 4A is a top view schematically illustrating a pixel array substrate according to the first embodiment of the present invention. FIG. 4B is a schematic cross-sectional view along sectional lines I-II, and IV-III of FIG. 4A. Referring to FIGS. 4A and 4B, a pixel array substrate 400 is formed by cutting the master 100 along the predetermined-cutting region 114, and thus components of the pixel array substrate 400 is the same as those of the master 100. The pixel array substrate 400 includes one substrate 110 and at least one ESD protection structure 130. The substrate 110 includes the display region 118 having a plurality of the pixels 116 and at least one peripheral circuit region 120 adjacent to the display region 118. In the present embodiment, at least one peripheral circuit region 120 surrounding the display region 118 is provided, which is not limited in the present invention. The ESD protection structure 130 disposed in the peripheral circuit region 120 and connected to the display region 118 has at least one first region 132 and at least one second region 134 adjacent to the first region 132. In addition, the sectional line I-II is located in the first region 132, the sectional line II-III is along an edge of the substrate 110, and the sectional line IV-III is located in the second region 134.

It is indicated by the sectional line I-II that the first opening 152 of the first patterned dielectric layer 150 exposes a portion of the first patterned conductive layer 140. In the present invention, the first opening 152 exposes the end of the first patterned conductive layer 140, and the patterned transparent conductive layer 160 is connected to the first patterned conductive layer 140. In the ESD protection structure 130, the end of the first patterned conductive layer 140 is away from the edge of the substrate 110. Accordingly, the first patterned conductive layer 140 is disposed outside a cross-section depicted by the sectional line II-III. That is to say, the side of the first patterned conductive layer 140 is not exposed by the edge of the substrate 110. On the other hand, the second patterned dielectric layer 170 covers the patterned transparent conductive layer 160 and the substrate 110. In practice, it is learned from the sectional line II-III that the second patterned dielectric layer 170 exposes one side of the patterned transparent conductive layer 160 on the second region 134.

If the electrostatic charges are accumulated within the pixel array substrate 400, the electrostatic charges are conducted to the patterned transparent conductive layer 160 through the first patterned conductive layer 140 and released out of the pixel array substrate 400. Therefore, the ESD protection structure 130 plays an important role on preventing the occurrence of the ESD event in the pixel array substrate 400, ensuring the quality of the pixel array substrate 400. Besides, as shown by the sectional line II-III, the conductive layer exposed outside the substrate 110 is the patterned transparent conductive layer 160 which is not made of the metallic material. Thereby, it is unlikely for the ESD protection structure 130 to have an exposed and corroded metallic cutting surface.

Second Embodiment

Figure 5:
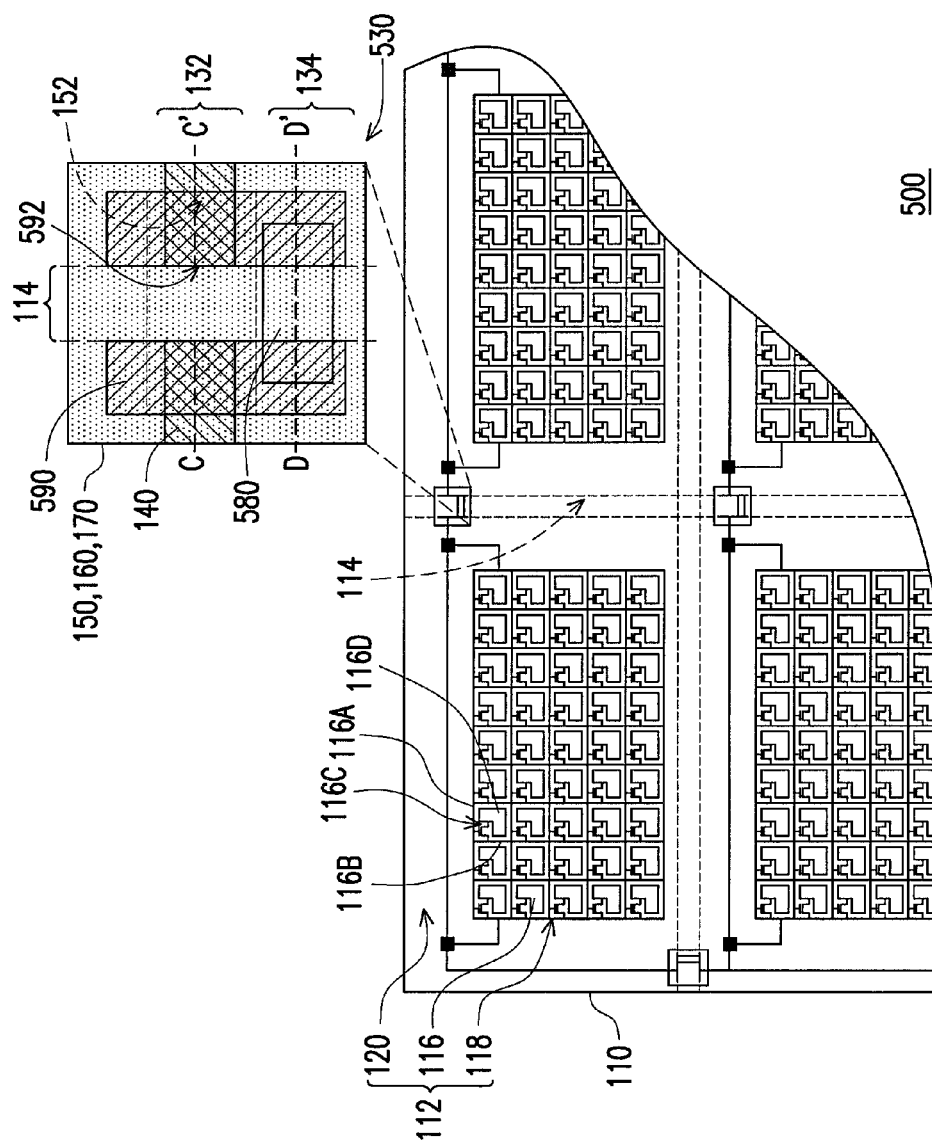
FIG. 5 is a partial top view schematically illustrating the master according to a second embodiment of the present invention.

FIG. 5 is a partial top view schematically illustrating the master according to a second embodiment of the present invention. Referring to FIG. 5, a master 500 is similar to the master 100 in the first embodiment, and thus the identical elements of the two masters 500 and 100 are not described hereinafter. The difference between the master 500 and the master 100 lies in that an ESD protection structure 530 of the master 500 further includes at least one of a patterned semiconductor layer 580 and a second patterned conductive layer 590.

The patterned semiconductor layer 580 is disposed in the second region 134, such that a portion of the first patterned dielectric layer 150 is disposed between the substrate 110 and the patterned semiconductor layer 580. The second patterned conductive layer 590 is disposed on the first patterned dielectric layer 150. Besides, the second patterned conductive layer 590 has at least a third opening 592 interlacing the first opening 152, such that the second patterned conductive layer 592 is away from the predetermined-cutting region 114 and is electrically connected to the first patterned conductive layer 140 and the patterned semiconductor layer 580. The patterned transparent conductive layer 160, is disposed on the substrate 110 such as on the first region 132 and second region 134, i.e. corresponds to the portion of the predetermined-cutting region 114, and electrically connects the first patterned conductive layer 140. In practice, the patterned transparent conductive layer 160 is, for example, electrically connected to the first patterned conductive layer 140 and the patterned semiconductor layer 580 through the second patterned conductive layer 590. The patterned transparent conductive layer 160 can be also electrically connected to the first patterned conductive layer 140 and the patterned semiconductor layer 580 given that no second patterned conductive layer 590 is disposed. In other words, the first patterned conductive layer 140 and the patterned semiconductor layer 580 can be electrically connected to each other through at least one of the patterned transparent conductive layer 160 and the second patterned conductive layer 590, so as to further electrically connect various segments of the first patterned conductive layer 140.

In the ESD protection structure 530, the first patterned conductive layer 140, the second patterned conductive layer 590, the patterned semiconductor layer 580, and the patterned transparent conductive layer 160 together form a complete or a successive conductive circuit, so as to prevent the ESD event from occurring in the master 500. Thereby, the master 500 is not apt to be damaged during its fabrication, and the manufacturing yield of the master 500 is improved as well. In addition, the conductive circuit in the predetermined-cutting region 114 of the ESD protection structure 530 is made of a non-metallic material such as transparent conductive material, semiconductor material, dielectric material, or others, or combinations thereof. Hence, after the master 500 is cut along the predetermined-cutting region 114, the cutting surface exposes no metal, and thus the quality of the master 500 can be guaranteed. In detail, a method of manufacturing the ESD protection structure 530 is schematically illustrated in the top views of FIGS. 6A~6E and the cross-sectional views of FIGS. 7A~7E. Here, FIGS. 6A through 6E illustrate the manufacturing process of the ESD protection structure along sectional lines C-C' and D-D' of FIG. 5.

Figure 6E:
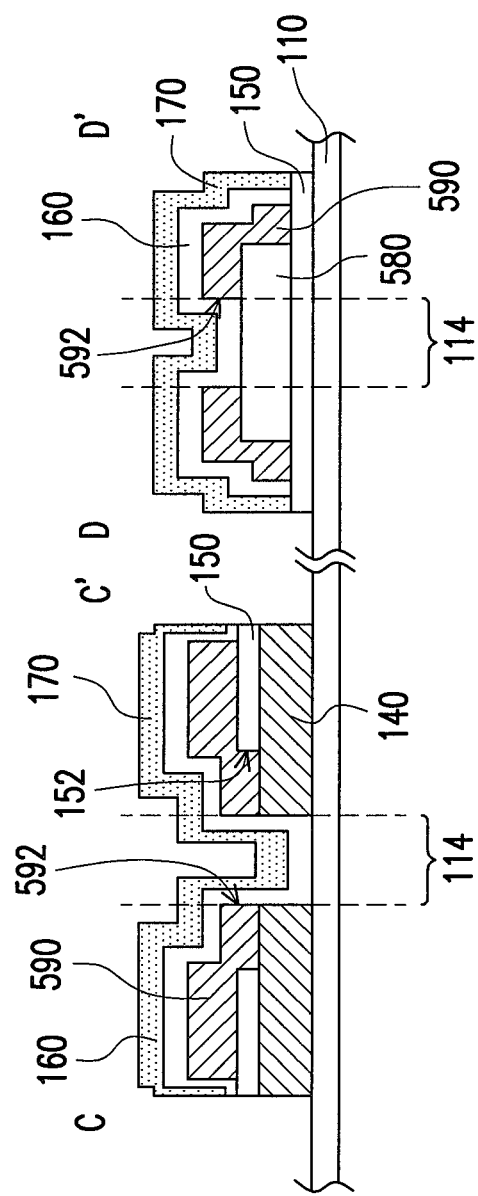
Figure 7A:
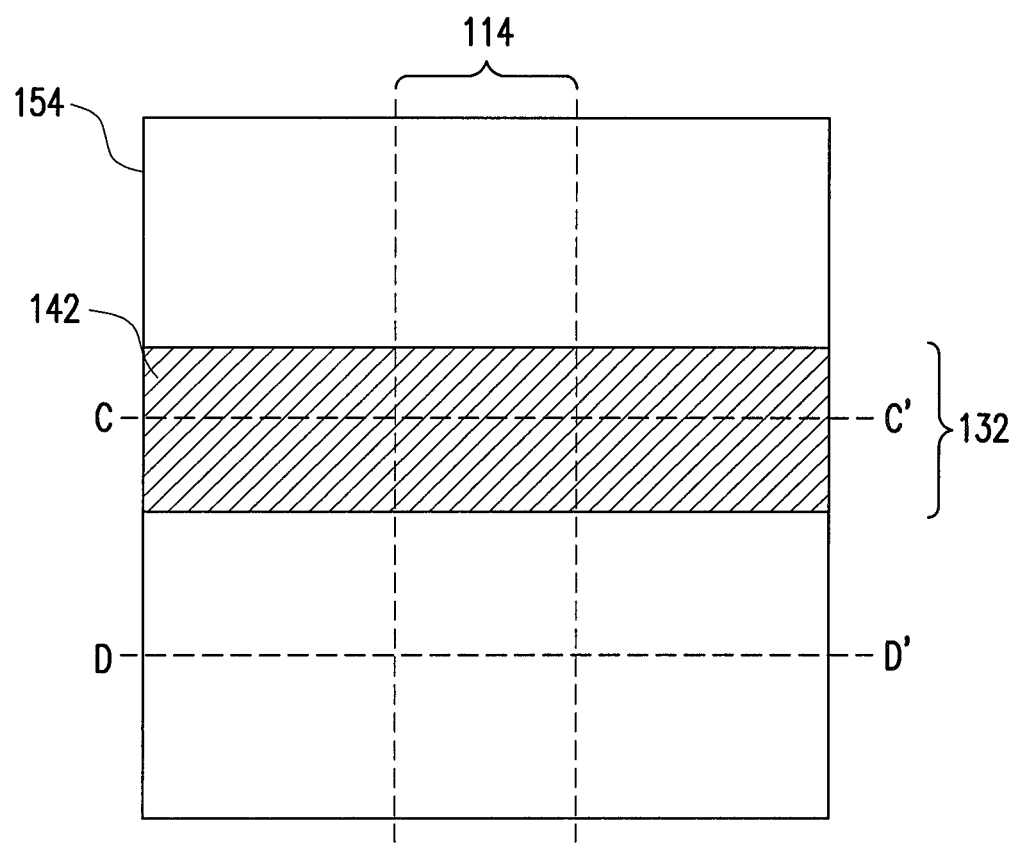
FIGS. 7A through 7E are partial top views illustrating the process of manufacturing the ESD protection structure of the master depicted in FIG. 5.

Referring to FIGS. 6A and 7A, the first conductive layer 142 and a first dielectric layer 154 are firstly formed on the substrate 110. Here, the step of forming the first conductive layer 142 is equivalent to that depicted in FIGS. 2A and 3A. Moreover, the first dielectric layer 154 covers the first conductive layer 142 and the substrate 110. Specifically, in the second region 134, the first dielectric layer 154 is directly disposed on the substrate 110. A material of the first dielectric layer 154 is, for example, the inorganic material (e.g. silicon oxide, silicon nitride, silicon oxynitride, silicon carbide, hafnium oxide, aluminum oxide, other materials, or a combination thereof), the organic material (e.g. photoresist, BCB, cycloolefin, polyimide, polyamide, polyester, polyalcohols, polyethylene, polyphenylene, resin, polyether, polyketone, other materials, or a combination thereof), or a combination thereof.

Figure 7B:
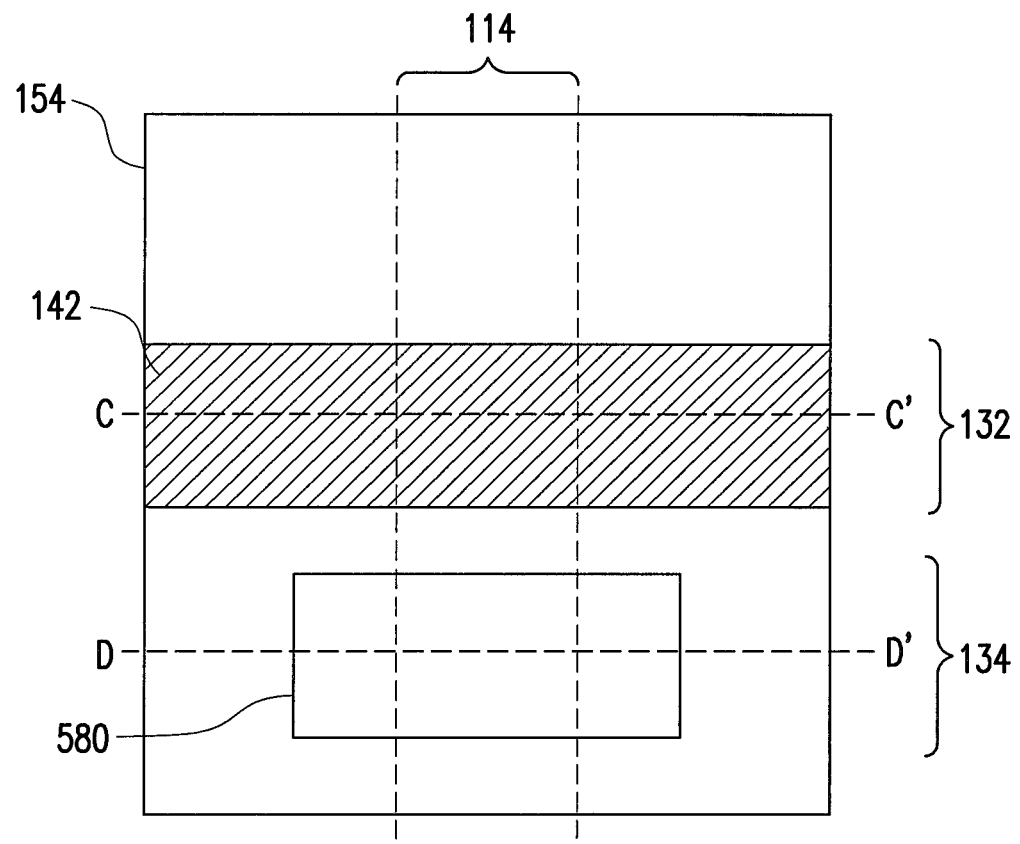

Thereafter, referring to FIGS. 6B and 7B, the patterned semiconductor layer 580 is formed at the side of the first conductive layer 142. The position of the patterned semiconductor layer 580 corresponds to that of the predetermined-cutting region 114, and the patterned semiconductor layer 580 neither overlaps nor interlaces the first conductive layer 142. The patterned semiconductor layer 580 is disposed on the first dielectric layer 154, i.e., in the second region 134, and the first dielectric layer 154 is disposed between the patterned semiconductor layer 580 and the substrate 110.

Figure 7C:
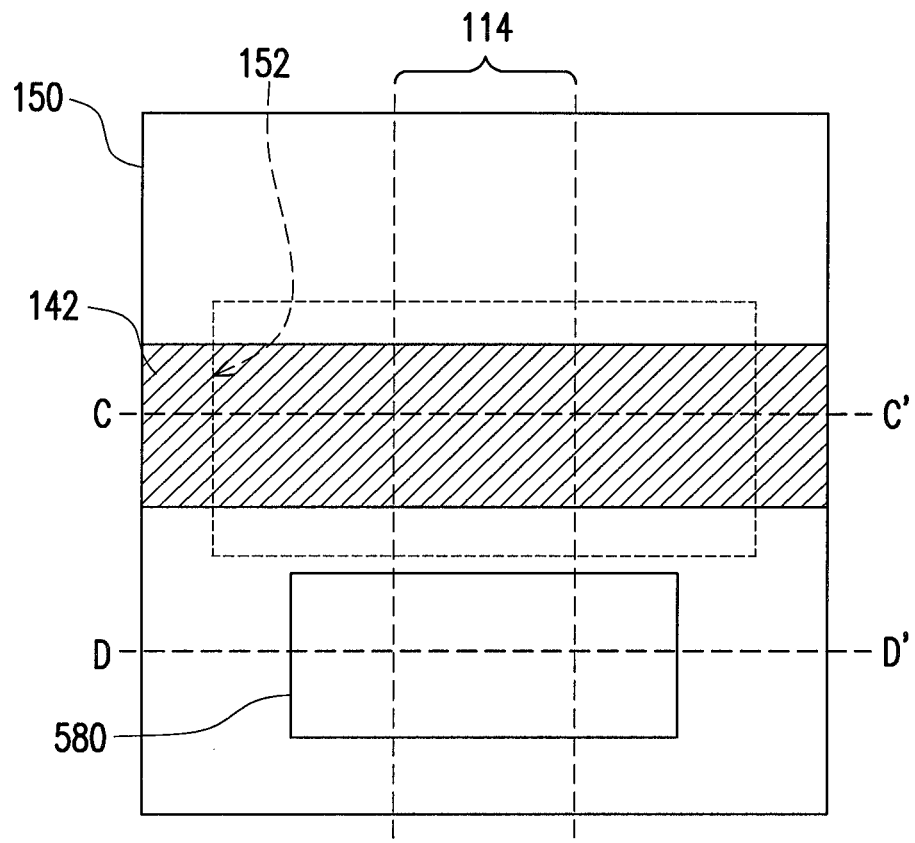

After that, referring to FIGS. 6C and 7C, the first opening 152 is formed in the first dielectric layer 154, such that the first dielectric layer 154 is patterned, and the first patterned dielectric layer 150 is then constructed. Here, a portion of the first patterned dielectric layer 150 is, for example, located between the patterned semiconductor layer 580 and the substrate 110. The first opening 152 overlaps a portion of the predetermined-cutting region 114 and exposes a portion of the first conductive layer 142. Since the consecutive first conductive layer 142 is able to conduct the electrostatic charges out of the substrate 110, the ESD damage to some of the elements can be prevented in each of the manufacturing processes discussed above.

Figure 7D:
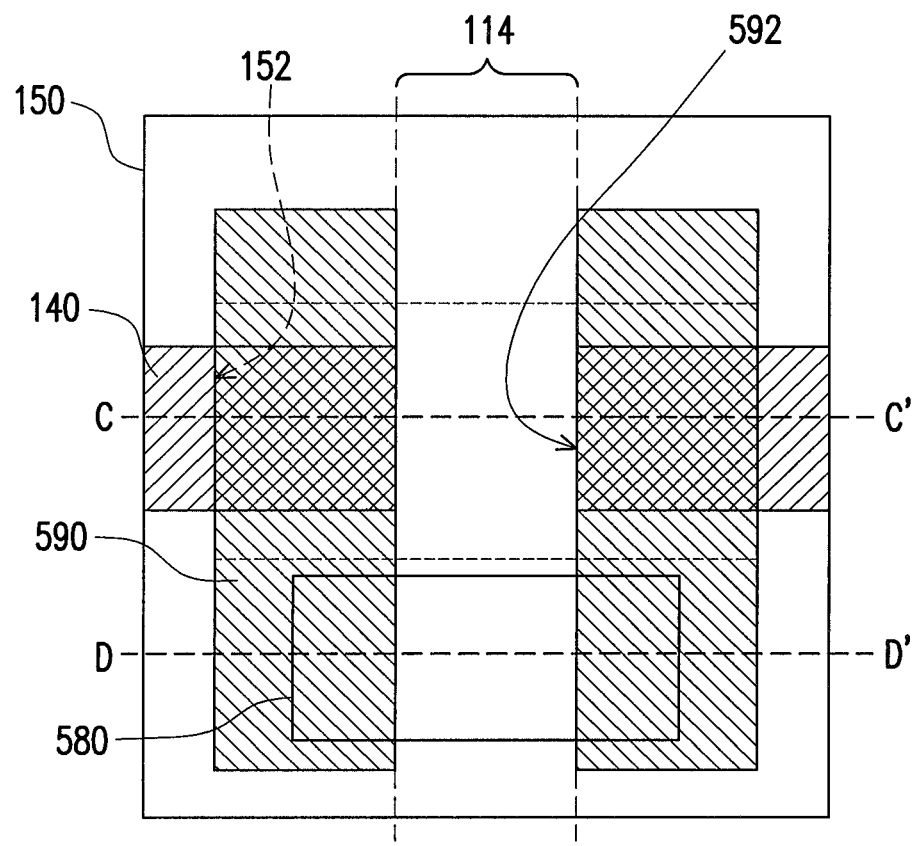

Afterwards, referring to FIGS. 6D and 7D, the second patterned conductive layer 590 is formed on the first patterned dielectric layer 150. In the present embodiment, a material of the second patterned conductive layer 590 is, for example, selected from the same or the different materials of the first patterned conductive layer 142, while the material of the first patterned conductive layer 142 can be selected from the materials described in the previous embodiment. The second patterned conductive layer 590 has at least one third opening 592 interlacing the first opening 152. An edge of the third opening 592 is approximately adjacent to or aligned to the edge of the predetermined-cutting region 114. In other words, the third opening 592, for example, substantially aligned with the predetermined-cutting region 114, i.e. exposes the predetermined-cutting region 114 and the portion of the patterned semiconductor layer 580 in the second region 134. Moreover, the third opening 592 divides the second patterned conductive layer 590 into a plurality of blocks. That is to say, the disposition of the third opening 592 results in the fact that the second patterned conductive layer 590 is substantially disposed outside the predetermined-cutting region 114.

Additionally, when the third opening 592 is formed, the first conductive layer 142 disposed within the third opening 592 is simultaneously removed, so as to form the first patterned conductive layer 140. Namely, the first patterned conductive layer 140 and the second patterned conductive layer 590 are constructed in the same patterning process. In correspondence with the location of the third opening 592, the edge of the first patterned conductive layer 140 and the edge of the second patterned conductive layer 590 are, for example, approximately aligned to each other. Thus, the first patterned conductive layer 140 and the second patterned conductive layer 590 are substantially disposed outside the predetermined-cutting region 114. Accordingly, the cutting region cut along the predetermined-cutting region 114 in the subsequent manufacturing process does not expose the metallic material constituting the first patterned conductive layer 140 and the second patterned conductive layer 590. Moreover, according to other embodiments, the patterning process may be performed on the first conductive layer 142 with use of the photomask in the process depicted in FIG. 6A, FIG. 6C or FIG. 6D, such that the first patterned conductive layer 140 can be formed at a different time from the time during which the patterning process of the second patterned conductive layer 590 is implemented. Accordingly, the first patterned conductive layer 140 is substantially disposed outside the predetermined-cutting region 114. As such, the cutting region cut along the predetermined-cutting region 114 in the subsequent manufacturing processes does not expose the metallic material constituting the first patterned conductive layer 140.

On the other hand, the first patterned conductive layer 140, the second patterned conductive layer 590, and the patterned semiconductor 580 together construct a consecutive conductive circuit. Although the first conductive layer 142 preventing the ESD damage is patterned to become the inconsecutive segments in this step, the conductive circuit comprising the first patterned conductive layer 140, the second patterned conductive layer 590, and the patterned semiconductor layer 580 is still capable of releasing the accumulated electrostatic charges out of the substrate 110 during the manufacturing process of the ESD protection structure 530 or on various manufacturing conditions. As a whole, the ESD protection circuit remains on the substrate 110, posing no impact on the manufacturing yield of the master 500.

Figure 7E:
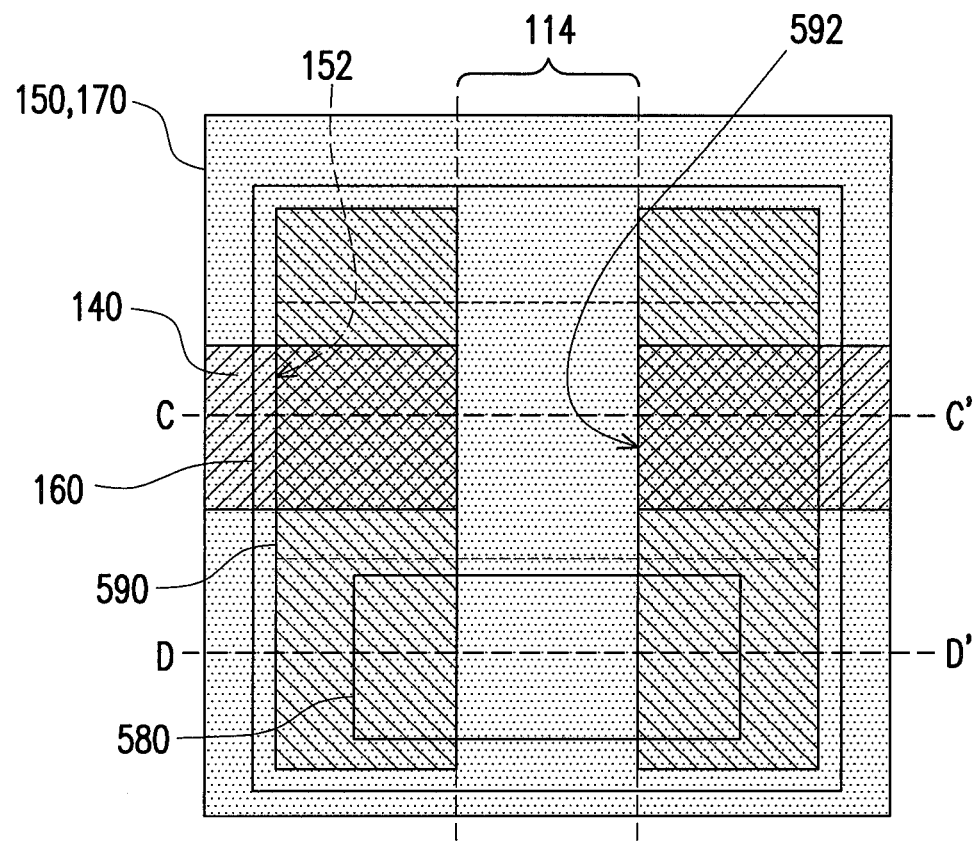

Next, referring to FIGS. 6E and 7E, the patterned transparent conductive layer 160 and the second patterned dielectric layer 170 are sequentially formed on the substrate 110, so as to form the ESD protection structure 530 depicted in FIG. 5. The material of the patterned transparent conductive layer 160 can be selected from the materials described in the previous embodiment. The patterned transparent conductive layer 160 is electrically connected to the second patterned conductive layer 590 and the patterned semiconductor layer 580. Practically, the patterned transparent conductive layer 160 electrically connects the second patterned conductive layer 590 at respective sides of the predetermined-cutting region 114. Hence, the disposition of the patterned transparent conductive layer 160 in the ESD protection structure 530 also contributes to releasing the electrostatic charges out of the substrate 110 and enhancing the manufacturing yield of the master 500. It is of certainty that a plurality of the pixels 116 as provided in the first embodiment can be formed in the display region 118 of each of the displaying units 112 during the formation of the ESD protection structure 530. Note that the manufacturing process of the ESD protection structure 530 is compatible with that of the pixels 116, and manufacturing the ESD protection structure 530 and the pixels 116 in different fabricating processes is allowed in the present invention. Nevertheless, in other embodiments, the formation of the second patterned conductive layer 590 may be omitted. Instead, the consecutive conductive circuit is constructed in the subsequent manufacturing processes. Here, the consecutive conductive circuit merely includes the first patterned conductive layer 140, the patterned semiconductor layer 580, and the patterned transparent conductive layer 160.

Figure 8A:
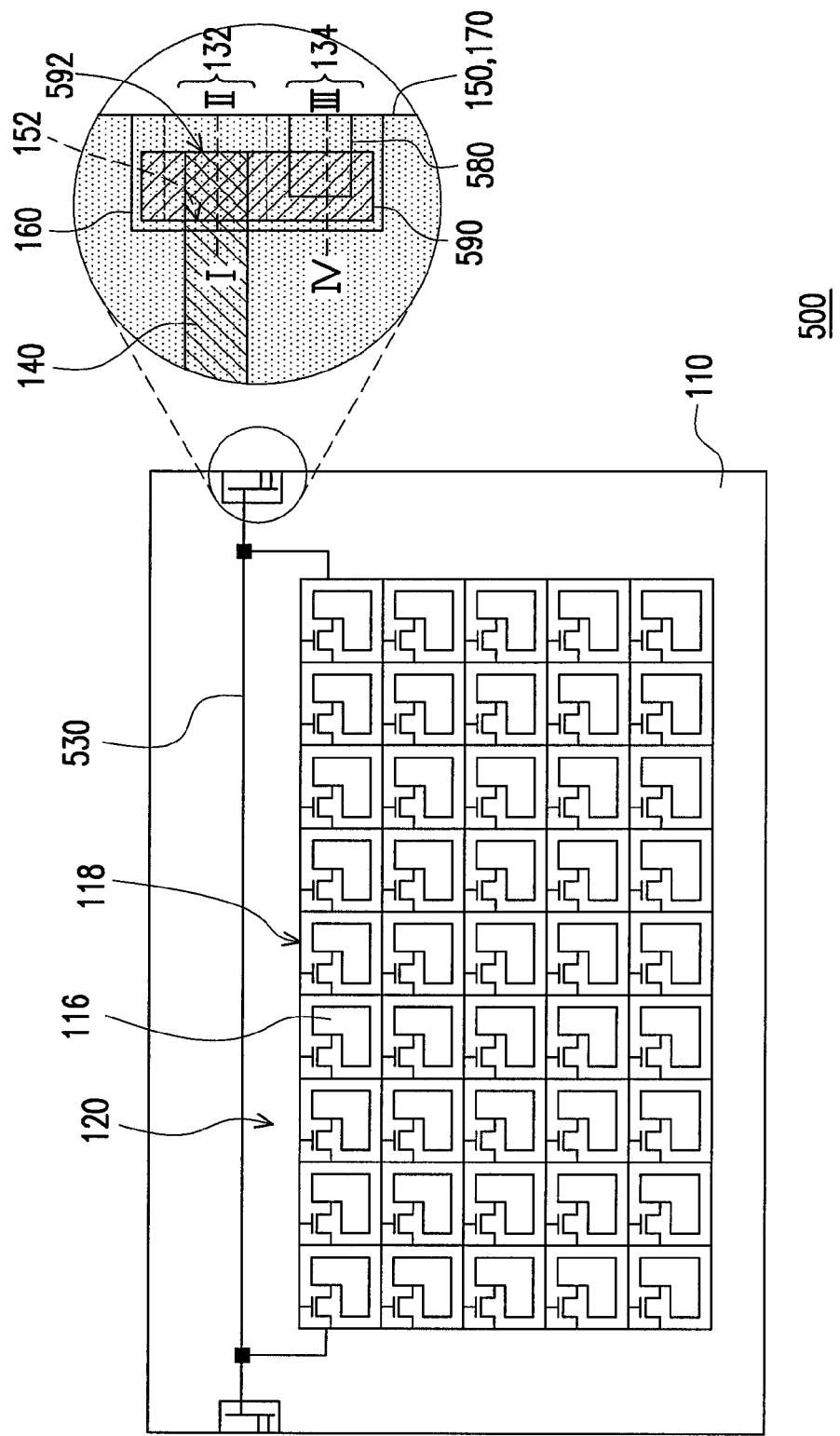
FIG. 8A is a top view schematically illustrating the pixel array substrate according to the second embodiment of the present invention.
Figure 8B:
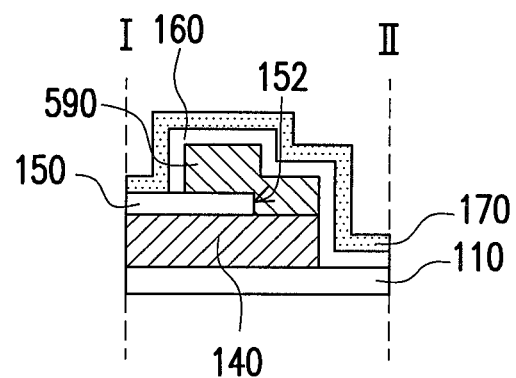
FIG. 8B is a schematic cross-sectional view along sectional lines I-II, and IV-III of FIG. 8A.
Figure 8B:
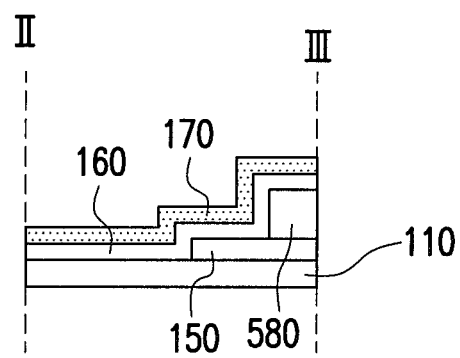
Figure 8B:
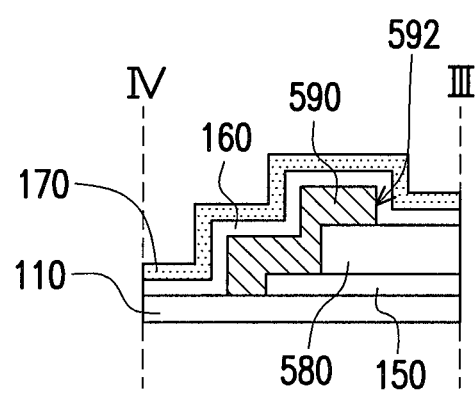

FIG. 8A is a top view schematically illustrating the pixel array substrate according to the second embodiment of the present invention. FIG. 8B is a schematic cross-sectional view along sectional lines I-II, and IV-III of FIG. 8A. Here, the sectional line I-II is located in the first region 132, the sectional line II-III is along the edge of the substrate 110, and the sectional line IV-III is located in the second region 134. Referring to FIGS. 8A and 8B, a pixel array substrate 800 is formed by cutting the master 500 of FIG. 5 along the predetermined-cutting region 114. The elements of the pixel array substrate 800 are the same as those of the master 500. Hence, in the ESD protection structure 530, the patterned transparent conductive layer 160 covers the second patterned conductive layer 590, the first patterned dielectric layer 150, a portion of the patterned semiconductor layer 580, and the substrate 110. In an alternative, the patterned transparent conductive layer 160 merely covers the first patterned dielectric layer 150, a portion of the patterned semiconductor layer 580, and the substrate 110.

As indicated by the sectional line II-III in the pixel array substrate 800, the second patterned dielectric layer 170 exposes one side of the patterned transparent conductive layer 160 on the second region 134, one side of the first patterned dielectric layer 150 thereon, one side of the patterned semiconductor layer 580 thereon, and one side of the patterned transparent conductive layer 160 on the first region 132. In other words, the conductive layer (e.g. the patterned transparent conductive layer 160 and the patterned semiconductor layer 580) exposed by the side of the pixel array substrate 800 is made of the non-metallic material. Therefore, in the subsequent inspecting process, it is unlikely for the pixel array substrate 800 to encounter an issue regarding the corrosion of metal.

Besides, in the ESD protection structure 530, the patterned transparent conductive layer 160 electrically connects the second patterned conductive layer 590 and a portion of the patterned semiconductor layer 580, while the second patterned conductive layer 590 is directly connected to the first patterned conductive layer 140. Alternatively, the patterned transparent conductive layer 160 electrically connects a portion of the patterned semiconductor layer 580 and the first patterned conductive layer 140. Hence, given that any ESD event occurs in the pixel array substrate 800, the ESD protection structure 530 is capable of releasing the electrostatic charges out of the pixel array substrate 800, so as to prevent the circuits or the elements from suffering the ESD damage. In brief, the pixel array substrate 800 of the present invention does not encounter the issue regarding the corrosion of the exposed metallic material. Further, the pixel array substrate 800 enjoys an extended lifetime. Besides, the satisfactory quality and the extended lifetime of the display panel applying the pixel array substrate 800 of the present embodiment can also be guaranteed.

Third Embodiment

Figure 9A:
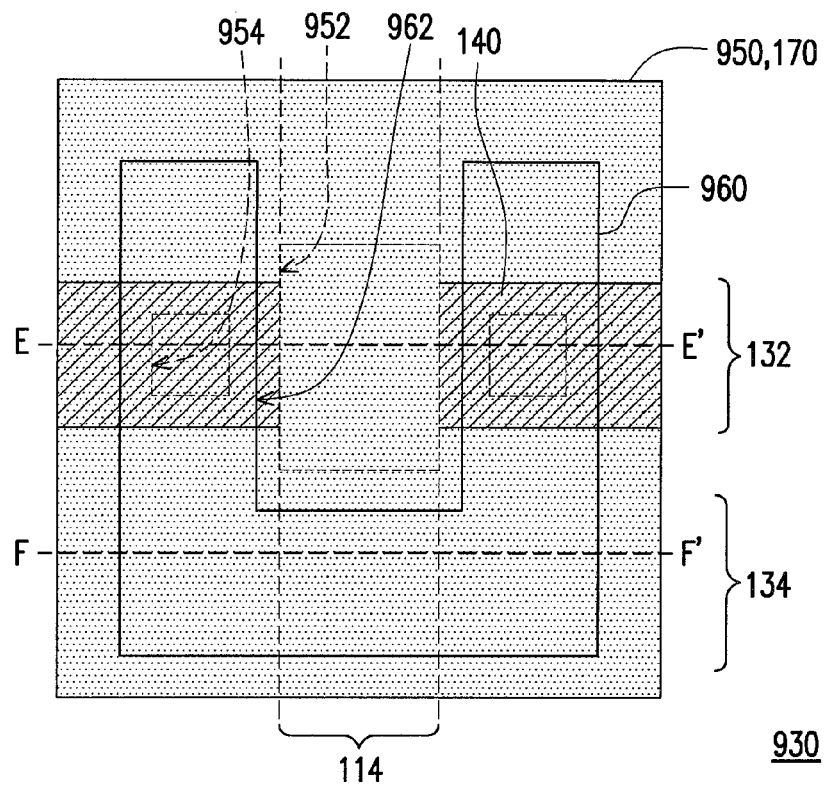
FIG. 9A is a top view schematically illustrating the ESD protection structure of the master according to a third embodiment of the present invention.
Figure 9B:
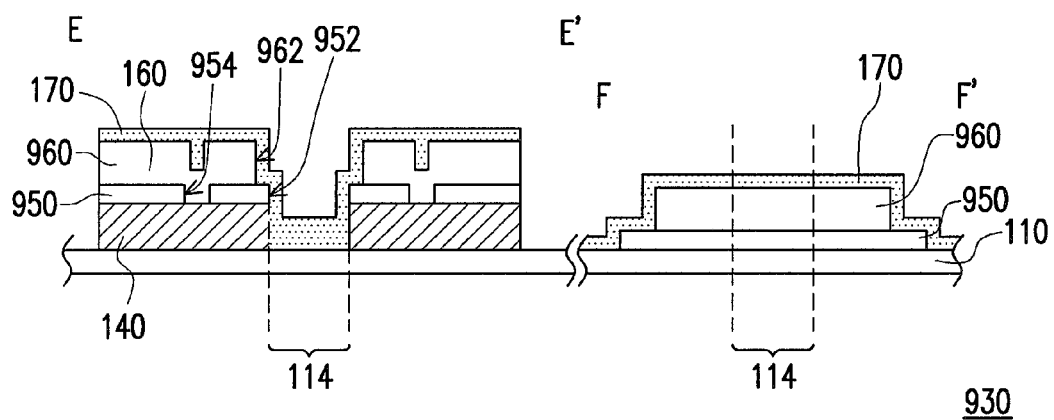
FIG. 9B is a cross-sectional view along sectional lines E-E' and F-F' of FIG. 9A.

FIG. 9A is a top view schematically illustrating the ESD protection structure of the master according to a third embodiment of the present invention. FIG. 9B is a cross-sectional view along sectional lines E-E' and F-F' of FIG. 9A. Referring to FIGS. 9A and 9B, in the present embodiment, an ESD protection structure 930 is similar to the ESD protection structure 130 of the master 100 described in the first embodiment, while the description, the manufacturing method, and the materials of the required elements of the ESD protection structure 930 can all be referred to those provided in the first embodiment. In the ESD protection structure 930, a first patterned dielectric layer 950 has a plurality of first openings 952 and 954. The first opening 952 corresponds to the predetermined-cutting region 114 and is approximately aligned to the edge of the first patterned conductive layer 140. By contrast, the first opening 954 is disposed at a place which is adjacent to the predetermined-cutting region 114 and exposes a portion of the first patterned conductive layer 140. Thereby, the first patterned conductive layer 140 can be electrically connected to a patterned transparent conductive layer 960 through the first opening 954.

Aside from the above, a second opening 962 of the patterned transparent conductive layer 960 exposes a portion of the first patterned dielectric layer 950 in the present embodiment, for example. Namely, in an extending direction of the first patterned conductive layer 140, a width of the second opening 962 is substantially greater than a width of the first opening 952, for example. The ESD protection structure 930 of the present embodiment has the same advantages as those described in the ESD protection structure 130 of the first embodiment. Accordingly, the ESD protection structure 930 of the present embodiment is capable of improving the manufacturing yield and the quality of the master or the pixel array substrate. In addition, the manufacturing method of the ESD protection structure 930 in the present embodiment can also be compatible with the conventional manufacturing method of the pixel array.

Further, in the present embodiment, when the master is cut to form a plurality of the pixel array substrates, no issue concerning the corrosion of the exposed metallic cutting surface takes place in the ESD protection structure 930. Besides, the cross-sectional structure along the edge of the substrate 110 is the same as the structure along the edge of the substrate 110 indicated by the sectional line II-III of the first embodiment.

Fourth Embodiment

Figure 10A:
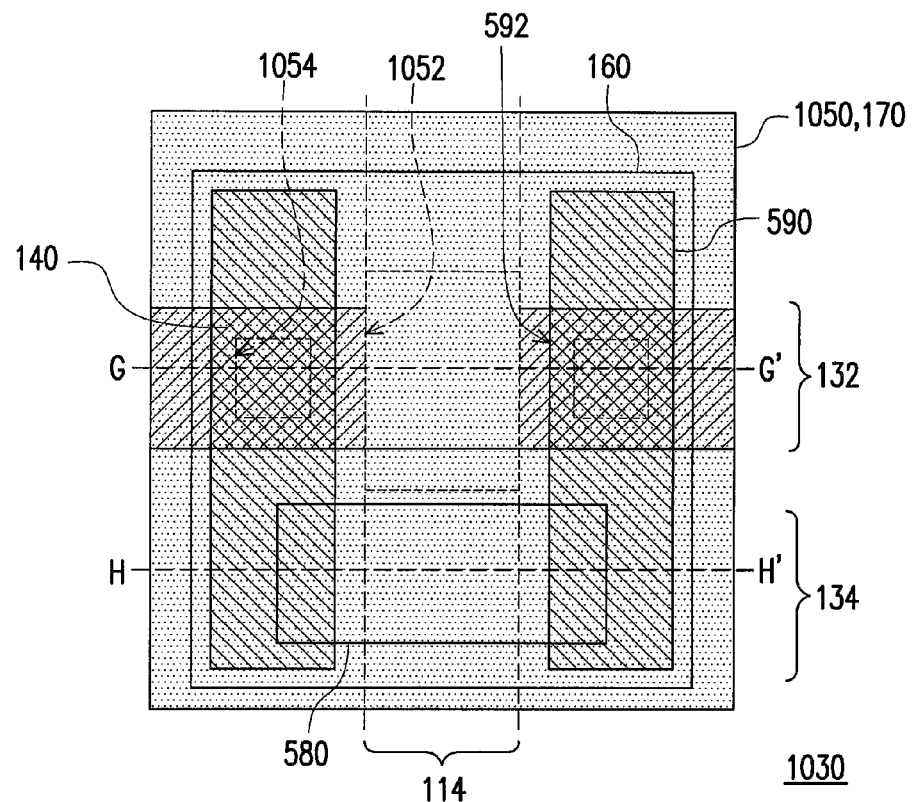
FIG. 10A is a top view schematically illustrating the ESD protection structure of the master according to a fourth embodiment of the present invention.
Figure 10B:
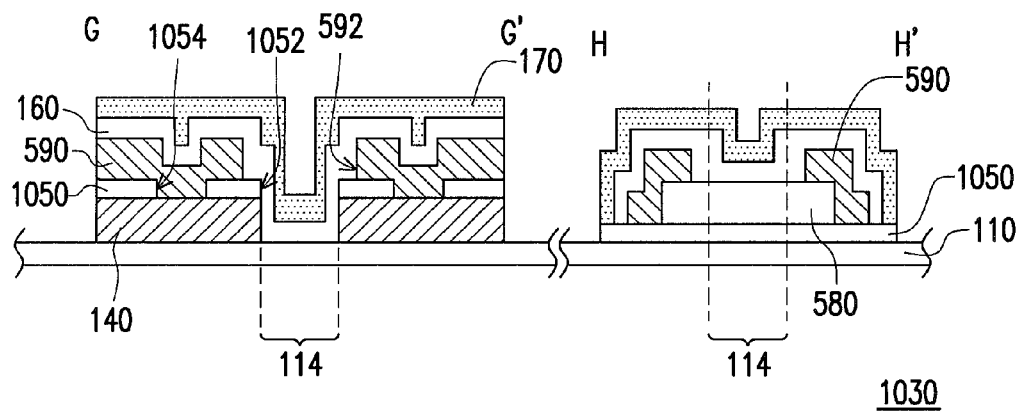
FIG. 10B is a cross-sectional view along sectional lines G-G' and H-H' of FIG. 10A.

FIG. 10A is a top view schematically illustrating the ESD protection structure of the master according to a fourth embodiment of the present invention. FIG. 10B is a cross-sectional view along sectional lines G-G' and H-H' of FIG. 10A. Referring to FIGS. 10A and 10B, in the present embodiment, an ESD protection structure 1030 is similar to the ESD protection structure 530 of the master 500 in the second embodiment, while the description, the manufacturing method, and the materials of the required elements of the ESD protection structure 1030 can all be referred to those provided in the second embodiment. In the ESD protection structure 1030, a first patterned dielectric layer 1050 has a plurality of first openings 1052 and 1054. The first opening 1052 corresponds to the predetermined-cutting region 114 and is approximately aligned to the edge of the first patterned conductive layer 140. By contrast, the first opening 1054 is disposed at a place which is adjacent to the predetermined-cutting region 114 and exposes a portion of the first patterned conductive layer 140. Additionally, the third opening 592 of the second patterned conductive layer 590 exposes a portion of the first patterned dielectric layer 1050 in the present embodiment, for example, such that the edge of the third opening 592 is located outside the predetermined-cutting region 114.

Practically, the first patterned conductive layer 140 is electrically connected to the second patterned conductive layer 590 through the first opening 1054, and can be further electrically connected to the patterned transparent conductive layer 160. The first patterned conductive layer 140 can also be electrically connected to the patterned transparent conductive layer 160 through the first opening 1054 if there is no second patterned conductive layer 590 disposed in the ESD protection structure 1030. The ESD protection structure 1030 of the present embodiment has the same advantages as those described in the ESD protection structure 530 of the second embodiment. Accordingly, the ESD protection structure 1030 of the present embodiment is capable of improving the manufacturing yield and the quality of the master or the pixel array substrate.

Further, in the present embodiment, when the master is cut to form a plurality of the pixel array substrates, no issue concerning the corrosion of the exposed metallic cutting surface takes place in the ESD protection structure 1030. Besides, the cross-sectional structure along the edge of the substrate 110 is the same as the structure along the edge of the substrate 110 indicated by the sectional line II-III of the second embodiment.

Fifth Embodiment

Figure 11A:
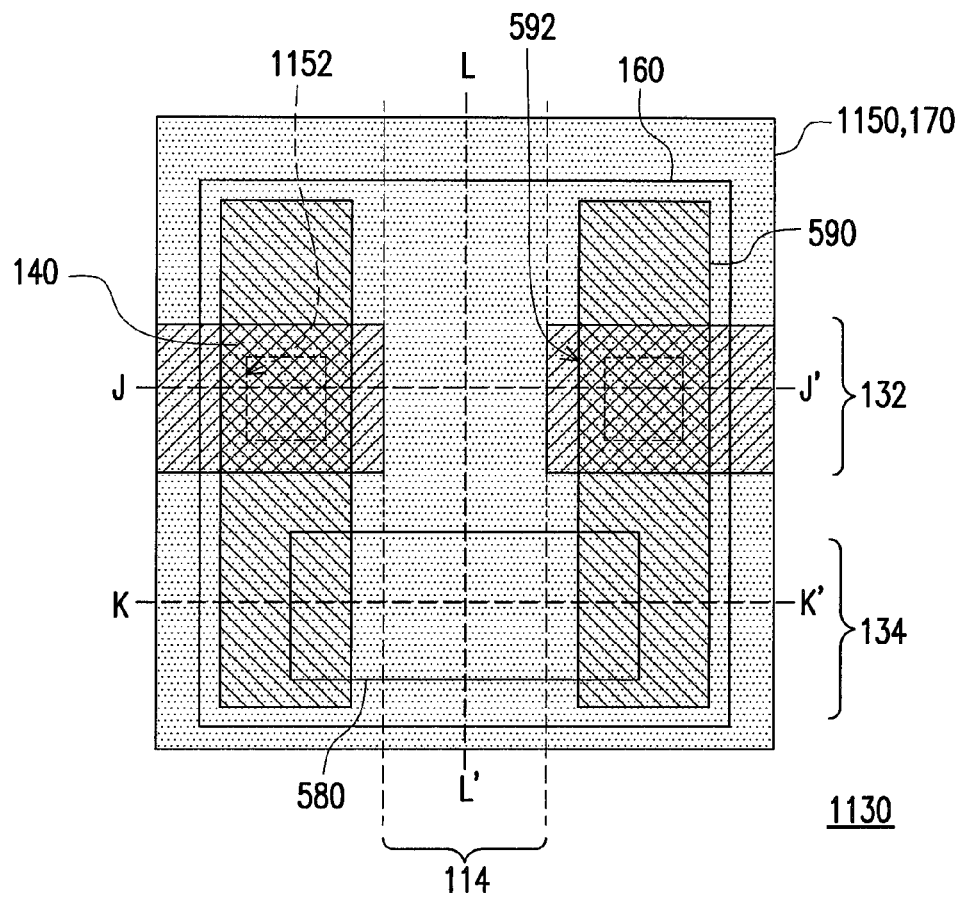
FIG. 11A is a top view schematically illustrating the ESD protection structure of the master according to a fifth embodiment of the present invention.
Figure 11B:
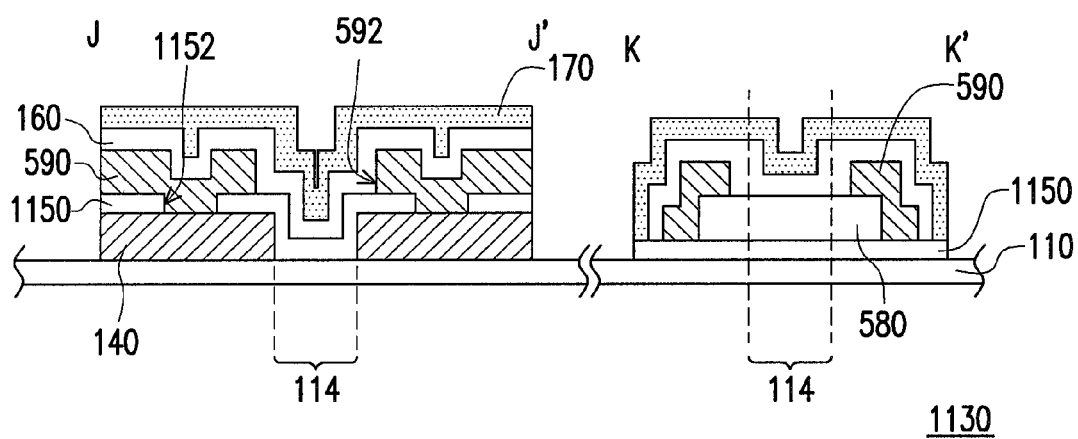
FIG. 11B is a cross-sectional view along sectional lines J-J' and K-K' of FIG. 11A.

FIG. 11A is a top view schematically illustrating the ESD protection structure of the master according to a fifth embodiment of the present invention. FIG. 11B is a cross-sectional view along sectional lines J-J' and K-K' of FIG. 11A. Referring to FIGS. 11A and 11B, in the present embodiment, an ESD protection structure 1130 is similar to the ESD protection structure 1030 in the fourth embodiment, while the description, the manufacturing method, and the materials of the required elements of the ESD protection structure 1130 can all be referred to those provided in the second embodiment. In the ESD protection structure 1130, a first opening 1152 of a first patterned dielectric layer 1150 is disposed at a place which is adjacent to the predetermined-cutting region 114 and exposes a portion of the first patterned conductive layer 140. That is to say, the opening corresponding to the predetermined-cutting region 114 is not disposed in the ESD protection structure 1130, representing the fact that the first opening 1152 of the present embodiment is not located within the predetermined-cutting region 114.

The first patterned conductive layer 140 is electrically connected to the second patterned conductive layer 590 through the first opening 1152, and can be further electrically connected to the patterned transparent conductive layer 160. The first patterned conductive layer 140 can also be electrically connected to the patterned transparent conductive layer 160 through the first opening 1152 if there is no second patterned conductive layer 590 disposed in the ESD protection structure 1130. In the present invention, the ESD protection structure 1130 is fabricated with use of different conductive materials. In addition, the conductive layer disposed in the predetermined-cutting region 114 is made of the non-metallic material, and thus no metallic material is exposed by the cutting surface along the predetermined-cutting region 110. Thus, the ESD protection structure 1130 has the same advantages as those of the ESD protection structure 530 as discussed in the second embodiment.

Figure 11C:
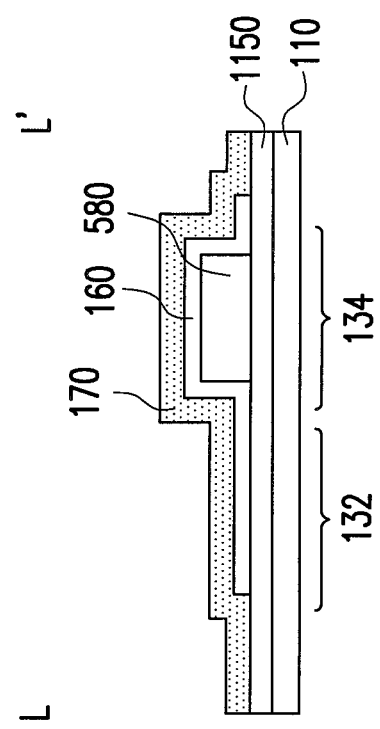
FIG. 11C is a cross-sectional view along a sectional line L-L' of FIG. 11A.

Practically, when the ESD protection structure 1130 is cut along the predetermined-cutting region 114, the cross-sectional view of the cutting surface is illustrated in FIG. 11C. As indicated in a sectional line L-L' of FIG. 11C, the exposed conductive layer includes the patterned semiconductor layer 580 and the patterned transparent conductive layer 160. Neither of the two conductive layers is made of the metallic material, and thus it is unlikely for the ESD protection structure 1130 to encounter the issue regarding the corrosion of the exposed metallic material after the cutting process is performed on the ESD protection structure 1130. Moreover, if the ESD protection structure 1130 proposed by the present invention is applied to an LCD panel, the LCD panel is able to accomplish a favorable display quality and enjoys a relatively long lifetime.

Further, it should be noted that the method of patterning each film layer described in the previous embodiments includes depositing, photoresist coating, and removing an unnecessary portion of each film layer by performing a photolithographic process and an etching process with use of the photomask. However, the film layer can be fabricated through implementing any other appropriate processes, such as an inkjet printing process, a printing process, any other manufacturing processes, or a combination thereof. Moreover, the photomask can either be a normal photomask merely having a transparent region and a non-transparent region or be a photomask with a various light transmission rates. In other words, the photomask with the various light transmission rates has the transparent region, the non-transparent region, and at least a semi-transparent region located between the transparent region and the non-transparent region, such as a slit mask, a half-tone mask, a gray-level mask, a diffraction mask, any other masks with the various light transmission rates, or a combination thereof.

Figure 12:
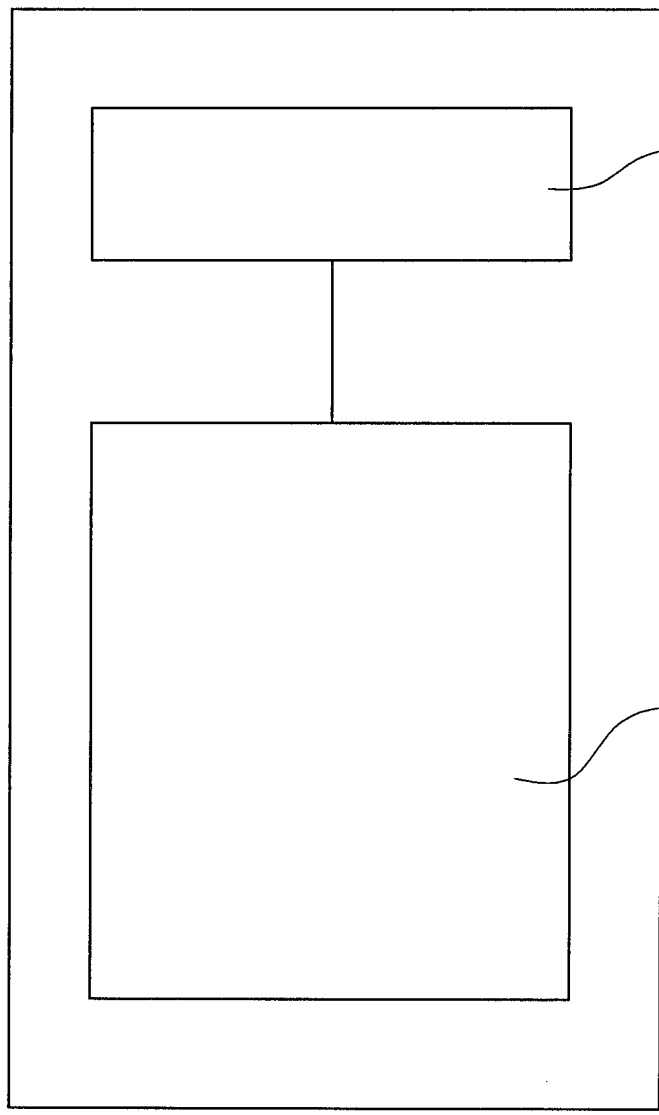
FIG. 12 is a schematic view of an electro-optical device according to one embodiment of the present invention.

FIG. 12 is a schematic view of an electro-optical device according to one embodiment of the present invention. As indicated in FIG. 12, the pixel array substrate formed in accordance with the previous embodiments can be applied to a display panel 1202, and the display panel 1202 and an electronic device 1204 electrically connected thereto together construct an electro-optical device 1200. Here, the electronic device 1204 includes a control device, an operating device, a treatment device, an input device, a memory device, a driving device, a light emitting device, a protection device, a sensing device, a detecting device, any other devices having other functions, or a combination thereof. On the other hand, the electro-optical device 1200 comprises a portable product (e.g. a mobile phone, a camcorder, a camera, a laptop computer, a game player, a watch, a music player, an e-mail receiver and sender, a map navigator, a digital picture, or the like), an audio-video product (e.g. an audio-video player or the like), a screen, a television, a bulletin, a panel in a projector, and so on.

In general, the finished display panel 1202 at least includes one pixel array substrate, another transparent substrate opposite to the aforesaid pixel array substrate, and display media disposed between the pixel array substrate and the transparent substrate. Here, the transparent substrate has one transparent conductive layer. As a material of the display media is a liquid crystal material, the display panel 1202 is referred to as the LCD panel (e.g. a transmissive display panel, a transflective display panel, a reflective display panel, a color-filter-on-array (COA) display panel, an array-on-color-filter (AOC) display panel, a vertical alignment (VA) display panel, an in-plane switched (IPS) display panel, a multi-domain vertical alignment (MVA) display panel, a twist nematic (TN) display panel, a super twist nematic (STN) display panel, a patterned vertical alignment (PVA) display panel, a super-patterned vertical alignment (S-PVA) display panel, an advance super view (ASV) display panel, a fringe field switching (FFS) display panel, a continuous pinwheel alignment (CPA) display panel, an axially symmetric aligned micro-cell mode (ASM) display panel, an optically compensated bend (OCB) display panel, a super-in-plane switched (S-IPS) display panel, an advanced super-in-plane switched (AS-IPS) display panel, an ultra-fringe field switching (UFFS) display panel, a polymer sustained alignment (PSA) display panel, a dual-view display panel, a triple-view display panel, a three-dimensional display panel, any other display panels, or a combination thereof). On the contrary, when the material of the display media is an organic electroluminescent material, the display panel 1202 is referred to as an organic electroluminescent display panel (e.g., a fluorescent organic electroluminescent display panel, a phosphor organic electroluminescent display panel, or a combination thereof). Here, the organic electroluminescent material of the organic electroluminescent display panel includes a small molecule electroluminescent material, a polymer electroluminescent material, or a combination thereof.

To sum up, in the master and the pixel array substrate of the present invention, the ESD protection structure is constructed by connecting the metallic conductive layers to the non-metallic conductive layers. Here, the non-metallic conductive layers are disposed corresponding to the predetermined-cutting region of the master. In the pixel array substrates formed by cutting the master, the exposed side of the ESD protection structure is made of the non-metallic material. Thereby, it is unlikely for the pixel array substrates to have the exposed and corroded metallic cutting surface. Moreover, in the manufacturing method of the master according to several embodiments of the present invention, the ESD protection circuit is furnished in every single manufacturing process, thereby improving the manufacturing yield of the master. As such, the pixel array substrates formed by cutting the master of the present invention are also characterized by the improved manufacturing yield. In conclusion, the present invention provides the master, the pixel array substrate, and the relevant electro-optical device featuring the desired manufacturing yield, the satisfactory quality, and the extended lifetime.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a master comprising a substrate and at least an electrostatic discharge protection structure, the substrate having a plurality of displaying units and a predetermined-cutting region therebetween, each of the displaying units comprising at least a peripheral circuit region and a display region having a plurality of pixels, so that the electrostatic discharge protection structure being located in the peripheral circuit regions, connected to the display regions, and having at least a first region and at least a second region adjacent to the first region, the method comprising:

forming a first patterned conductive layer on a first section of the first region, wherein a part of the predetermined-cutting region is configured at a second section of the first region and the first section is not overlapping with the second section;

forming a first patterned dielectric layer on the first patterned conductive layer and the substrate, the first patterned dielectric layer having at least a first opening exposing the part of the predetermined-cutting region at the second section of the first region and a portion of the first patterned conductive layer on the first section of the first region;

forming a patterned transparent conductive layer on the substrate, the patterned transparent conductive layer being at least configured on another part of the predetermined-cutting region on the second region and electrically connecting the first patterned conductive layer; and forming a second conformal patterned dielectric layer over the first patterned dielectric layer covering the patterned transparent conductive layer and the substrate.

2. The method according to claim 1, further comprising forming at least a second opening in the patterned transparent conductive layer corresponding to the first opening.

3. The method according to claim 1, further comprising forming a patterned semiconductor layer in the second region, such that a portion of the first patterned dielectric layer is disposed between the substrate and the patterned semiconductor layer.

4. The method according to claim 3, further comprising forming a second patterned conductive layer on the first patterned dielectric layer, the second patterned conductive layer having at least a third opening interlacing the first opening, such that the second patterned conductive layer is away from the predetermined-cutting region and is electrically connected to the first patterned conductive layer and the patterned semiconductor layer.

5. A method of manufacturing a pixel array substrate, the method comprising:
- providing a master fabricating by the method as claimed in claim 4; and
- cutting the master along the predetermined-cutting region, wherein a side of the patterned transparent conductive layer on the first region, a side of the patterned transparent conductive layer on the second region, a side of the first patterned dielectric layer thereon, and a side of the patterned semiconductor layer thereon are exposed.

6. A method of manufacturing an electro-optical device, comprising the method of manufacturing the pixel array substrate of claim 5.

7. A method of manufacturing a pixel array substrate, the method comprising:
- providing a master fabricating by the method as claimed in claim 1; and
- cutting the master along the predetermined-cutting region, wherein an end of the first patterned conductive layer on the first region and an end of the patterned transparent conductive layer thereon are covered by the second patterned dielectric layer, and a side of the patterned transparent conductive layer on the second region is exposed.

8. A method of manufacturing an electro-optical device, comprising the method of manufacturing the pixel array substrate of claim 7.

* * * * *